United States Patent
Cole et al.

(10) Patent No.: US 8,133,639 B2
(45) Date of Patent: Mar. 13, 2012

(54) HOLOGRAPHIC RECORDING MEDIUM WITH CONTROL OF PHOTOPOLYMERIZATION AND DARK REACTIONS

(75) Inventors: Michael C. Cole, Longmont, CO (US); Fredric R. Askham, Loveland, CO (US); William L. Wilson, Longmont, CO (US)

(73) Assignee: Inphase Technologies, Inc., Longmont, CO (US)

( * ) Notice: Subject to any disclaimer, the term of this patent is extended or adjusted under 35 U.S.C. 154(b) by 5 days.

(21) Appl. No.: 12/625,849

(22) Filed: Nov. 25, 2009

(65) Prior Publication Data

US 2011/0123911 A1    May 26, 2011

Related U.S. Application Data

(62) Division of application No. 11/067,010, filed on Feb. 28, 2005, now Pat. No. 7,704,643.

(51) Int. Cl.
*G03H 1/02* (2006.01)
(52) U.S. Cl. .......... 430/1; 430/2; 430/280.1; 430/281.1; 359/3
(58) Field of Classification Search .................. None
See application file for complete search history.

(56) References Cited

U.S. PATENT DOCUMENTS

| | | | |
|---|---|---|---|
| 2,787,634 | A | 4/1957 | Coover et al. |
| 3,658,526 | A | 4/1972 | Haugh |
| 3,867,153 | A | 2/1975 | MacLachlan |
| 4,168,982 | A | 9/1979 | Pazos |
| 4,292,152 | A | 9/1981 | Lechtken et al. |
| 4,427,760 | A | 1/1984 | Nagazawa et al. |
| 4,526,945 | A | 7/1985 | Carlson et al. |
| 4,587,201 | A | 5/1986 | Morikawa et al. |
| 4,680,354 | A | 7/1987 | Lin et al. |
| 4,925,768 | A | 5/1990 | Iwasaki et al. |
| 4,942,112 | A | 7/1990 | Monroe et al. |
| 5,001,243 | A | 3/1991 | Fischer et al. |
| 5,024,909 | A | 6/1991 | Smothers et al. |
| 5,058,124 | A | 10/1991 | Cameron et al. |

(Continued)

FOREIGN PATENT DOCUMENTS

WO    WO 9807758 A1    2/1998

(Continued)

OTHER PUBLICATIONS

Psaltis et al., "Holographic Memories," Scientific American, Nov. 1995.

(Continued)

*Primary Examiner* — Martin Angebrannndt
(74) *Attorney, Agent, or Firm* — Vedder Price P.C.; Ajay A. Jagtiani

(57) ABSTRACT

The present invention relates to a system, as well as articles and holographic recording medium comprising the system, where the system comprises: a polymerizable component comprising at least one photoactive polymerizable material; and a photoinitiator component comprising at least one photoinitiator for causing the polymerizable component to polymerize to thereby form a plurality of holographic gratings when activated by exposure to a photoinitiating light source; wherein when a portion of the polymerizable component has been polymerized to form at least one holographic grating, the unpolymerized portion of the polymerizable component is resistant to further polymerization when not exposed to the photoinitiating light source. The present invention also provides methods for forming at least one holographic grating in a holographic recording medium having such a photopolymerizable system.

32 Claims, 9 Drawing Sheets

U.S. PATENT DOCUMENTS

| | | |
|---|---|---|
| 5,219,710 A | 6/1993 | Horn et al. |
| 5,279,689 A | 1/1994 | Shvartsman |
| 5,292,620 A | 3/1994 | Booth et al. |
| 5,377,179 A | 12/1994 | Redfield |
| 5,473,450 A | 12/1995 | Yamada et al. |
| 5,719,691 A | 2/1998 | Curtis et al. |
| 5,759,721 A | 6/1998 | Dhal et al. |
| 5,776,376 A | 7/1998 | Nagoh et al. |
| 5,874,187 A | 2/1999 | Colvin et al. |
| 5,932,045 A | 8/1999 | Campbell et al. |
| 6,047,008 A | 4/2000 | Funakawa |
| 6,103,454 A | 8/2000 | Dhar et al. |
| 6,414,763 B1 | 7/2002 | Hesselink et al. |
| 6,449,627 B1 | 9/2002 | Baer et al. |
| 6,482,551 B1 | 11/2002 | Dhar et al. |
| 6,495,295 B1 | 12/2002 | Shioda et al. |
| 6,614,566 B1 | 9/2003 | Curtis et al. |
| 6,650,447 B2 | 11/2003 | Curtis et al. |
| 6,743,552 B2 | 6/2004 | Setthachayanon et al. |
| 6,765,061 B2 | 7/2004 | Dhar et al. |
| 6,780,546 B2 | 8/2004 | Trentler et al. |
| 6,811,937 B2 | 11/2004 | Lawton |
| 7,092,133 B2 | 8/2006 | Anderson et al. |
| 7,704,643 B2 * | 4/2010 | Cole et al. .................. 430/1 |
| 2003/0035917 A1 | 2/2003 | Hyman |
| 2003/0129501 A1 | 7/2003 | Megens et al. |
| 2003/0206320 A1 | 11/2003 | Cole et al. |
| 2003/2027204 | 11/2003 | Sugasaki et al. |
| 2003/0224250 A1 | 12/2003 | Setthachayanon et al. |
| 2004/0027625 A1 | 2/2004 | Trentler et al. |
| 2004/0027652 A1 | 2/2004 | Erdogan et al. |

FOREIGN PATENT DOCUMENTS

| | | |
|---|---|---|
| WO | WO 9962460 A1 | 12/1999 |

OTHER PUBLICATIONS

Smothers et al., Photopolymers for Holography, SPIE OE/Laser Conference, Los Angeles, California, 1990, pp. 1212-03.

Hariharan, P. "Optical Holography: Principles, Techniques and Applications," Cambridge University Press, Cambridge, 1991, p. 44.

Solymar, L. & Cooke, D., "Volume Holography and Volume Gratings," Academic Press, 1981, pp. 315-327.

Ludman, J.E. et al., "Very Thick Holographic Nonspatial Filtering of Laser Beams" Optical Engineering, vol. 36, No. 6, 1700, 1997.

Booth, B.L., "Optical Interconnection Polymers," in Polymers for Lightwave and Integrated Optics, Technology and Applications, L.A. Hornak, ed., Marcel Dekker, Inc., 1992.

Liu et al. "holographic gratings in photosensitive acrylic polymers with high refractive index diphenyl sulfide", J. Polymer Research vol. 11 pp. 43-51 (2004).

Pu et al., "Exposure schedule for multiplexing holograms in photopolymer films", Opt. Eng. vol. 35(10) pp. 2824-2829 (Oct. 1996).

Van et al. "Multiplexing hologrtams in the phtotopolymer with .." Proc. SPIE vol. 5643 pp. 109-117 (pub Jan. 2005, presented Nov. 2004).

PCT/US06/06749 International Search Report and the Written Opinion of the International Searching Authority, or the Declaration, mailed Aug. 2, 2007.

PCT/US07/06094 International Search Report and the Written Opinion of the International Searching Authority, or the Declaration, mailed Aug. 22, 2008.

PCT/US06/19906 International Search Report and the Written Opinion of the International Searching Authority, or the Declaration, mailed Sep. 16, 2008.

* cited by examiner

HOLOGRAPHIC RECORDING MEDIUM WITH CONTROL OF PHOTOPOLYMERIZATION AND DARK REACTIONS

CROSS-REFERENCE TO RELATED APPLICATION

This is a divisional application of U.S. patent application Ser. No. 11/067,010, entitled "HOLOGRAPHIC RECORDING MEDIUM WITH CONTROL OF PHOTOPOLYMERIZATION AND DARK REACTIONS" filed on Feb. 28, 2005 now U.S. Pat. No. 7,704,643, pending. The entire disclosure and contents of the above patents and applications are hereby incorporated by reference.

BACKGROUND

1. Field of the Invention

The present invention relates to a holographic recording medium.

2. Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of an entire two-dimensional representation, e.g., a page of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in Psaltis et al., "Holographic Memories," Scientific American, November 1995.

One method of holographic storage is phase correlation multiplex holography, which is described in U.S. Pat. No. 5,719,691 (Curtis et al.), issued Feb. 17, 1998. In one embodiment of phase correlation multiplex holography described in Curtis et al., a reference light beam is passed through a phase mask, and intersected in the recording medium with a signal beam that has passed through an array representing data, thereby forming a hologram in the medium. The spatial relation of the phase mask and the reference beam is adjusted for each successive page of data, thereby modulating the phase of the reference beam and allowing the data to be stored at overlapping areas in the medium. The data is later reconstructed by passing a reference beam through the original storage location with the same phase modulation used during data storage. It is also possible to use volume holograms as passive optical components to control or modify light directed at the medium, e.g., filters or beam steerers. Writing processes that provide refractive index changes are also capable of forming articles such as waveguides.

The capabilities of typical holographic recording systems are determined in part by the storage medium. One type of holographic recording media used recently for such systems are photosensitive polymer films. See, e.g., Smothers et al., "Photopolymers for Holography," SPIE OE/Laser Conference, 1212-03, Los Angeles, Calif., 1990. The holographic recording media described in this article contain a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light.

During writing (recording) of information into the material (by passing recording light through an array representing data), the monomer polymerizes in the exposed regions. Due to the lowering of the monomer concentration caused by the polymerization, monomer from the dark, unexposed regions of the material diffuses to the exposed regions. The polymerization and resulting diffusion create a refractive index change, thus forming the hologram (holographic grating) representing the data.

Generally, in photopolymer systems used in conventional applications such as coatings, sealants, adhesives, etc., properties such as chain length and degree of polymerization are usually maximized and driven to completion by using very high light intensities, multifunctional monomers, high concentrations of monomers, heat, etc. Similarly, prior holographic recording media have used formulations that are higher in monomer concentration (as in typical photopolymer formulations) to provide holographic recording media based on organic photopolymer systems. See, for example, U.S. Pat. No. 5,874,187 (Colvin et al.), issued Feb. 23, 1999, and U.S. Pat. No. 5,759,721 (Dhal et al.), issued Jun. 2, 1998, which disclose what are often referred to as "one-component" organic photopolymer systems. Such one-component systems typically have large Bragg detuning values if they are not precured with light to some extent. Further improvements in holographic photopolymer media have also been made by separating the formation of the polymeric matrix from the photochemistry used to record holographic information. See, for example, U.S. Pat. No. 6,103,454 (Dhar et al.), issued Aug. 15, 2000, and commonly assigned, U.S. Pat. No. 6,482,551 (Dhar et al.), issued Nov. 19, 2002, which disclose what are often referred to as "two-component" organic photopolymer systems. Two-component organic photopolymer systems allow for more uniform starting conditions (i.e., regarding the recording process), more convenient processing and packaging options, and the ability to obtain very high dynamic range media with very little shrinkage or Bragg detuning.

Thus, even though large improvements in holographic media have been made, further improvements in such media would be desirable to: (1) preserve the specified pattern of holographic gratings in the media to allow for reliable retrieval of the recorded data in such media; (2) allow for appropriate scheduling in forming holographic gratings in the media; (3) more accurately determine the time needed for recording additional holographic gratings in the same volume of previously recorded media, up to the full dynamic range thereof; and (4) in general, to create more commercially viable high density holographic data storage media.

SUMMARY

According to a first broad aspect of the present invention, there is provided a system comprising:
  a polymerizable component comprising at least one photoactive polymerizable material; and
  a photoinitiator component comprising at least one photoinitiator for causing the polymerizable component to polymerize to thereby form at least one holographic grating when activated by exposure to a photoinitiating light source;
  wherein when a portion of the polymerizable component has been polymerized to form at least one holographic grating, the unpolymerized portion of the polymerizable component is resistant to further polymerization when the polymerizable component is not exposed to the photoinitiating light source.

According to a second broad aspect of the present invention, there is provided an article comprising a support matrix and a photopolymerizable system in the support matrix, the photopolymerizable system comprising:
- a polymerizable component comprising at least one photoactive polymerizable material; and
- a photoinitiator component comprising at least one photoinitiator for causing the polymerizable component to polymerize to thereby form at least one holographic grating in the support matrix when activated by exposure to a photoinitiating light source;
- wherein when a portion of the polymerizable component has been photopolymerized to form at least one holographic grating, the unpolymerized portion of the polymerizable component is resistant to further polymerization when not exposed to the photoinitiating light source.

According to a third broad aspect of the present invention, there is provided a method comprising the following steps:
- (a) providing at least one holographic recording medium; and
- (b) forming at least one holographic grating in the holographic recording medium, wherein the holographic recording medium has a photopolymerizable system comprising:
- a polymerizable component comprising at least one photoactive polymerizable material; and
- a photoinitiator component comprising at least one photoinitiator for causing the polymerizable component to polymerize to thereby form a plurality of holographic gratings in the holographic recording medium when activated by exposure to recording light;
- wherein the unpolymerized portion of the polymerizable component is resistant to further polymerization when not exposed to the recording light.

According to a fourth broad aspect of the present invention, there is provided a method comprising the steps of:
- (a) providing a holographic recording medium; and
- (b) forming a plurality of holographic gratings in the holographic recording medium, wherein each holographic grating in the holographic recording medium is formed by exposing the holographic recording medium to recording light according to a schedule that is a function of when the holographic recording medium was exposed to the recording light versus the time period of each exposure to the recording light, and wherein the holographic recording medium has a photopolymerizable system comprising:
- a polymerizable component comprising at least one photoactive polymerizable material; and
- a photoinitiator component comprising at least one photoinitiator for causing the polymerizable component to polymerize to thereby form a plurality of holographic gratings in the holographic recording medium when activated by exposure to recording light;
- wherein the unpolymerized portion of the polymerizable component is resistant to further polymerization when not exposed to the recording light.

According to a fifth broad aspect of the present invention, there is provided a method comprising the following steps:
- (a) providing a holographic recording medium having therein one or more first holographic gratings; and
- (b) forming one or more additional holographic gratings in the holographic recording medium, wherein the holographic recording medium has a photopolymerizable system comprising:
- an unpolymerized portion of a polymerizable component comprising at least one photoactive polymerizable material; and
- a photoinitiator component comprising at least one photoinitiator for causing the unpolymerized portion of the polymerizable component to polymerize to thereby form at least one additional holographic grating in the holographic recording medium when activated by exposure to recording light;
- wherein the unpolymerized portion of the polymerizable component is resistant to further polymerization when not exposed to the recording light.

According to an sixth broad aspect of the present invention, there is provided a method comprising the following steps:
- (a) providing a recording medium having therein a plurality of first holographic gratings in a volume thereof; and
- (b) forming a plurality of additional holographic gratings in the holographic recording medium in the volume of the holographic recording medium, wherein the plurality of additional holographic gratings are formed according to a schedule that is a function of when each additional holographic grating is formed versus the time period taken to form each additional holographic grating, and wherein the holographic medium has a photopolymerizable system comprising:
- an unpolymerized portion of a polymerizable component comprising at least one photoactive polymerizable material; and
- a photoinitiator component comprising at least one photoinitiator for causing the polymerizable component of the unpolymerized portion to polymerize to thereby form a plurality of additional holographic gratings in the holographic recording medium when activated by exposure to recording light;
- wherein the unpolymerized portion of the polymerizable component is resistant to further polymerization when not exposed to the recording light.

BRIEF DESCRIPTION OF THE DRAWINGS

The invention will be described in conjunction with the accompanying drawings, in which.

DETAILED DESCRIPTION

Figure 1:
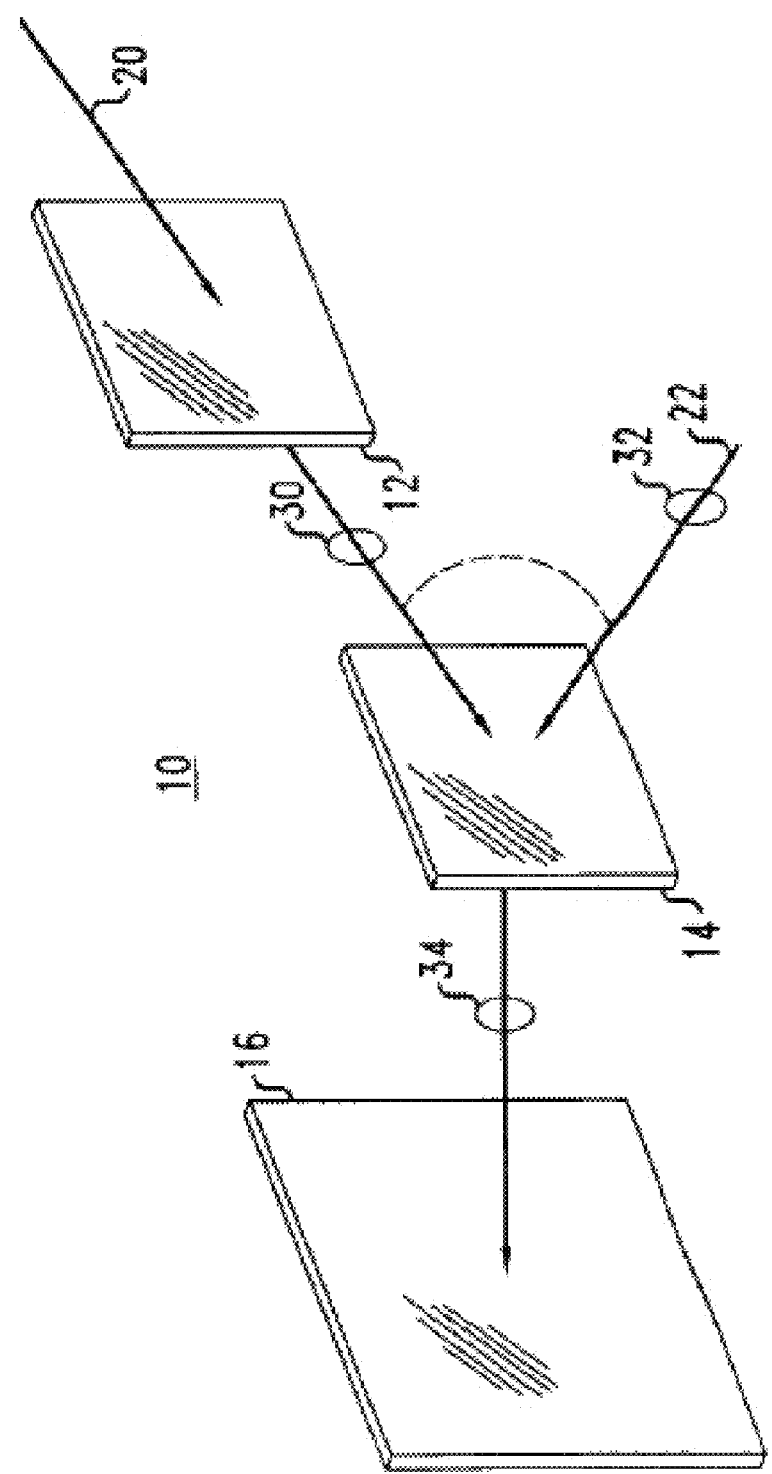
FIG. 1 shows a basic holographic storage system according to the present invention.

It is advantageous to define several terms before describing the invention. It should be appreciated that the following definitions are used throughout this application.

DEFINITIONS

Where the definition of terms departs from the commonly used meaning of the term, applicant intends to utilize the definitions provided below, unless specifically indicated.

For the purposes of the present invention, the term "light source" refers to any source of electromagnetic radiation of any wavelength. In one embodiment, the light source of the present invention is a laser of a particular wavelength.

For the purposes of the present invention, the term "photoinitiating light source" refers to a light source that activates a photoinitiator, a photoactive polymerizable material, or both. Photoiniating light sources include recording light, etc.

For the purposes of the present invention, the term "spatial light intensity" refers to a light intensity distribution or patterns of varying light intensity within a given volume of space.

For the purposes of the present invention, the term "holographic grating" or "hologram" are used in the conventional sense of referring to a recorded interference pattern formed when a signal beam and a reference beam interfere with each other. In cases where in digital data is recorded, the signal beam is encoded with a spatial light modulator.

For the purposes of the present invention, the term "holographic recording" refers to a holographic grating after it is recorded in the holographic recording medium.

For the purposes of the present invention, the term "holographic recording medium" refers to an article that is capable of recording and storing, in three dimensions, one or more holographic gratings as one or more pages as patterns of varying refractive index imprinted into an article.

For the purposes of the present invention, the term "data page" or "page" refers to the conventional meaning of data page as used with respect to holography. For example, a data page may be a page of data, one or more pictures, etc., to be recorded in a holographic recording medium, such as an article of the present invention.

For the purposes of the present invention, the term "recording light" refers to a light source used to record into a holographic medium. The spatial light intensity pattern of the recording light is what is recorded. Thus, if it is a simple noncoherent beam of light then a waveguide may be created, or if it is two interfering laser beams, then interference patterns will be recorded.

For the purposes of the present invention, the term "recording data" refers to storing holographic representations of one or more pages as patterns of varying refractive index.

For the purposes of the present invention, the term "reading data" refers to retrieving data stored as holographic representations.

For the purposes of the present invention, the term "exposure" refers to when a holographic recording medium was exposed to recording light, i.e., when the holographic grating was recorded in the medium.

For the purposes of the present invention, the terms "time period of exposure" and "exposure time" refer interchangeably to how long the holographic recording medium was exposed to recording light, i.e., how long the recording light was on during the recording of a holographic grating in the holographic recording medium. "Exposure time" can refer to the time required to record a single hologram or the cumulative time for recording a plurality of holograms in a given volume.

For the purposes of the present invention, the term "schedule" refers to the pattern, plan, scheme, sequence, etc., of the exposures relative to the cumulative exposure time in recording holographic gratings in a medium. In general, the schedule allows one to predict the time (or light energy) needed for each single exposure, in a set of plural exposures, to give a predetermined diffraction efficiency.

For the purposes of the present invention, the term "function" when used with the term "schedule" refers to a graphical plot or mathematical expression that defines or describes a schedule of exposures versus cumulative exposure time in recording plural holographic gratings.

For the purposes of the present invention, the term "substantially linear function" when used with the term "schedule" refers to a graphical plot of the schedule of exposures versus exposure time that provides a straight line or substantially a straight line.

For the purposes of the present invention, the term "support matrix" refers to the material, medium, substance, etc., in which the polymerizable component is dissolved, dispersed, embedded, enclosed, etc. The support matrix is typically a low $T_g$ polymer. The polymer may be organic, inorganic, or a mixture of the two. The polymer may also be either a thermoset or thermoplastic.

For the purposes of the present invention, the term "different form" refers to an article of the present invention being processed to form a product having a different form such as processing an article comprising a block of material, powder of material, chips of material, etc. into a molded product, a sheet, a free flexible film, a stiff card, a flexible card, an extruded product, a film deposited on a substrate, etc.

For the purposes of the present invention, the term "particle material" refers to a material that is made by grinding, shredding, fragmenting or otherwise subdividing an article into smaller components or to a material that is comprised of small components such as a powder.

For the purposes of the present invention, the term "free flexible film" refers to a thin sheet of flexible material that maintains its form without being supported on a substrate. Examples of free flexible films include the various types of plastic wraps used in food storage.

For the purposes of the present invention, the term "stiff article" refers to an article that may crack or crease when bent. An example of a stiff article is a plastic credit card, a DVD, a transparency, wrapping paper, a shipping box, etc.

For the purposes of the present invention, the term "volatile compound" refers to any chemical with a high vapor pressure and/or a boiling point below about 150° C. Examples of volatile compounds include: acetone, methylene chloride, toluene, etc. An article, mixture or component is "volatile compound free" if the article, mixture or component does not include a volatile compound.

For the purposes of the present invention, the term "oligomer" refers to a polymer having approximately 30 repeat units or less or any large molecule able to diffuse at least about 100 nm in approximately 2 minutes at room temperature when dissolved in the article of the present invention. Such oligomers may contain one or more polymerizable groups whereby the polymerizable groups may be the same or different from other possible monomers in the polymerizable component. Furthermore, when more than one polymerizable group is present on the oligomer, they may be the same or different. Additionally, oligomers may be dendritic. Oligomers are considered herein to be photoactive monomers, although they are sometimes referred to as "photoactive oligomer(s)".

For the purposes of the present invention, the term "photopolymerization" refers to any polymerization reaction caused by exposure to a photoinitiating light source.

For the purposes of the present invention, the term "resistant to further polymerization" refers to the unpolymerized portion of the polymerizable component having a deliberately controlled and substantially reduced rate of polymerization when not exposed to a photoiniating light source such that dark reactions are minimized, reduced, diminished, eliminated, etc. A substantial reduction in the rate of polymerization of the unpolymerized portion of the polymerizable component according to the present invention can be achieved by any suitable composition, compound, molecule, method, mechanism, etc., or any combination thereof, including using one or more of the following: (1) a polymerization retarder; (2) a polymerization inhibitor; (3) a chain transfer agent; (4) metastable reactive centers; (5) a light or heat labile phototerminator; (6) photo-acid generators, photo-base generators or photogenerated radicals; (7) polarity or solvation effects; (8) counter ion effects; and (9) changes in monomer reactivity.

For the purposes of the present invention, the term "substantially reduced rate" refers to a lowering of the polymerization rate to a rate approaching zero, and ideally a rate of zero, within seconds after the photoinitiating light source is off or absent. The rate of polymerization should typically be reduced enough to prevent the loss in fidelity of previously recorded holograms.

For the purposes of the present invention, the term "dark reaction" refers to any polymerization reaction that occurs in absence of a photoinitiating light source. Dark reactions can deplete unused monomer (loss of dynamic range), can cause noise gratings (including stray light gratings), or can cause unpredictability in the scheduling used for recording additional holograms.

For the purposes of the present invention, the term "free radical polymerization" refers to any polymerization reaction that is initiated by any molecule comprising a free radical or radicals.

For the purposes of the present invention, the term "cationic polymerization" refers to any polymerization reaction that is initiated by any molecule comprising a cationic moiety or moieties.

For the purposes of the present invention, the term "anionic polymerization" refers to any polymerization reaction that is initiated by any molecule comprising an anionic moiety or moieties.

For the purpose of the present invention, the term "photoinitiator" refers to the conventional meaning of the term photoinitiator and also refers to sensitizers and dyes. In general, a photoinitiator causes the light initiated polymerization of a material, such as a photoactive oligomer or monomer, when the material containing the photoinitiator is exposed to light of a wavelength that activates the photoinitiator, i.e., a photoinitiating light source. The photoinitiator may refer to a combination of components, some of which individually are not light sensitive, yet in combination are capable of curing the photoactive oligomer or monomer, examples of which include a dye/amine, a sensitizer/iodonium salt, a dye/borate salt, etc.

For the purposes of the present invention, the term "photoinitiator component" refers to a single photoinitiator or a combination of two or more photoinitiators. For example, two or more photoinitiators may be used in the photoinitiator component of the present invention to allow recording at two or more different wavelengths of light.

For the purposes of the present invention the term "polymerizable component" refers to a mixture of one or more photoactive polymerizable materials, and possibly one or more additional polymerizable materials (i.e., monomers and/or oligomers) that are capable of forming a polymer.

For the purposes of the present invention, the term "photoactive polymerizable material" refers to a monomer, an oligomer and combinations thereof that polymerize in the presence of a photoinitiator that has been activated by being exposed to a photoinitiating light source, e.g., recording light. In reference to the functional group that undergoes curing, the photoactive polymerizable material comprises at least one such functional group. It is also understood that there exist photoactive polymerizable materials that are also photoinitiators, such as N-methylmaleimide, derivatized acetophenones, etc. In such a case, it is understood that the photoactive monomer and/or oligomer of the present invention may also be a photoinitiator.

For the purposes of the present invention, the term "photopolymer" refers to a polymer formed by one or more photoactive polymerizable materials, and possibly one or more additional monomers and/or oligomers.

For the purposes of the present invention, the term "polymerization retarder" refers to one or more compositions, compounds, molecules, etc., that are capable of slowing, reducing, etc., the rate of polymerization while the photoinitiating light source is off or absent, or inhibiting the polymerization of the polymerizable component when the photoinitiating light source is off or absent. A polymerization retarder is typically slow to react with a radical (compared to an inhibitor), thus while the photoinitiating light source is on, polymerization continues at a reduced rate because some of the radicals are effectively terminated by the retarder. However, at high enough concentrations, a polymerization retarder can potentially behave as a polymerization inhibitor. For the purposes of the present invention, it is desirable to be within the concentration range that allows for retardation of polymerization to occur, rather than inhibition of polymerization.

For the purposes of the present invention, the term "polymerization inhibitor" refers to one or more compositions, compounds, molecules, etc., that are capable of inhibiting or substantially inhibiting the polymerization of the polymerizable component when the photoinitiating light source is on or off. Polymerization inhibitors typically react very quickly with radicals and effectively stop a polymerization reaction. Inhibitors cause an inhibition time during which little to no photopolymer forms (i.e., only very small chains). Typically, photopolymerization occurs only after nearly 100% of the inhibitor is reacted.

For the purposes of the present invention, the term "chain transfer agent" refers to one or more compositions, compounds, molecules, etc. that are capable of interrupting the growth of a polymeric molecular chain by formation of a new radical that may react as a new nucleus for forming a new polymeric molecular chain. Typically, chain transfer agents cause the formation of a higher proportion of shorter polymer chains, relative to polymerization reactions that occur in the absence of chain transfer agents. Additionally, traditional chain transfer agents can behave as retarders or inhibitors if they do not efficiently reinitiate polymerization.

For the purposes of the present invention, the term "metastable reactive centers" refers to one or more compositions, compounds, molecules, etc., that have the ability to create pseudo-living radical polymerizations with certain polymerizable components. It is also understood that infrared light or heat may be used to activate metastable reactive centers towards polymerization.

For the purposes of the present invention, the term "light or heat labile phototerminators" refers to one or more compositions, compounds, components, materials, molecules, etc., capable of undergoing reversible termination reactions using a light source and/or heat.

For the purposes of the present invention, the terms "photo-acid generators" "photo-base generators" and "photogenerated radicals" refer to one or more compositions, compounds, molecules, etc., that, when exposed to a light source, generate one or more compositions, compounds, molecules, etc., that are acidic, basic or a free radical.

For the purposes of the present invention, the term "polarity or solvation effects" refers to an effect or effects that the solvent or the polarity of the medium has on the polymerization rate. This effect is most pronounced for ionic polymerizations wherein the proximity of the counter ion to the reactive chain end influences the polymerization rate.

For the purposes of the present invention, the term "counter ion effects" refers to the effect that counter ion, in ionic polymerizations, has on the kinetic chain length. Good counter ions allow for very long kinetic chain lengths, whereas poor counter ions tend to collapse with the reactive chain end, thus terminating the kinetic chain (i.e., causing smaller chains to be formed).

For the purposes of the present invention, the term "plasticizer" refers to the conventional meaning of the term plasticizer. In general, a plasticizer is a compound added to a polymer both to facilitate processing and to increase the flexibility and/or toughness of a product by internal modification (solvation) of a polymer molecule.

For the purposes of the present invention, the term "thermoplastic" refers to the conventional meaning of thermoplastic, i.e., a composition, compound, substance, etc., that exhibits the property of a material, such as a high polymer, that softens when exposed to heat and generally returns to its original condition when cooled to room temperature. Examples of thermoplastics include, but are not limited to: poly(methyl vinyl ether-alt-maleic anhydride), poly(vinyl acetate), poly(styrene), poly(propylene), poly(ethylene oxide), linear nylons, linear polyesters, linear polycarbonates, linear polyurethanes, etc.

For the purposes of the present invention, the term "room temperature thermoplastic" refers to a thermoplastic that is solid at room temperature, i.e., will not cold flow at room temperature.

For the purposes of the present invention, the term "room temperature" refers to the commonly accepted meaning of room temperature.

For the purposes of the present invention, the term "thermoset" refers to the conventional meaning of thermoset, i.e., a composition, compound, substance, etc., that is crosslinked such that it does not have a melting temperature. Examples of thermosets are crosslinked poly(urethanes), crosslinked poly(acrylates), crosslinked poly(styrene), etc.

Description

The present invention is based on the discovery that a holographic recording medium using photopolymerization to record data therein suffers from "dark reactions." These "dark reactions" can continue long after the recording of data in the medium has stopped, e.g., after the recording light has been shut off, and are independent of the particular polymerization mechanism used, e.g., these reactions can occur in free radical, cationic, and anionic initiated and catalyzed photopolymerizations, etc. Over a relatively short period of time (e.g., within as little as 5 minutes after the recording light has been shut off), these "dark reactions" can cause noise gratings to grow in a holographic recording medium, eventually obscuring the previously recorded data. Because the desired pattern of holographic gratings recorded in the medium has been altered by these "dark reactions," the medium can become unusable and unreliable for retrieval of the recorded data.

The present invention is additionally based on the discovery that these "dark reactions" can complicate the desired scheduling of holographic recording in the medium. When recording numerous holograms in a given volume of material, it is desirable to record holograms of similar diffraction efficiency. To provide high density holographic data storage, a large number of relatively weak holographic images, (diffraction efficiency<<1%) are typically recorded. This can be achieved by varying the amount of exposure time for each holographic grating that is recorded. The schedule for recording such holographic gratings is also desirably a substantially linear function of the number of exposures (i.e., when the holographic grating was formed) versus the time period of each exposure (i.e., how long the recording light was on during the formation of the holographic grating).

These "dark reactions" can create undesired nonlinear dependencies in such scheduling. Such nonlinear scheduling is caused by at least two variables, namely, the time between exposures and the initial dynamic range of the medium. For holographic data storage to be commercially viable, it is sometimes necessary to record several holographic gratings in a volume of the medium, and then sometime later record additional holographic gratings in the same volume. "Dark reactions" can prevent or make extremely difficult the accurate determination of the time needed for recording additional holographic gratings for efficient and full utilization of the dynamic range of the medium. The larger the original dynamic range of the medium, the more pronounced this nonlinear scheduling problem has been found to become. Indeed, these "dark reactions" can consume a portion, up to all of the remaining dynamic range of the medium, thus reducing or preventing the ability to record additional holographic gratings therein.

The present invention is further based on the discovery that these "dark reactions" are caused by the lack of termination of reactions when the recording light source is turned off. Related to this phenomenon, stray light can lead to uncontrolled polymerization, even when no longer exposed to a source of photoinitiating light (e.g., recording light). This uncontrolled polymerization has been found to cause the development of stray light gratings in the holographic recording medium that eventually alter and obscure the desired pattern of holographic gratings recorded in the medium. This type of "dark reaction" caused by stray light (such as from substrate reflections) during recording can use up a portion or all of the remaining dynamic range of the volume of the medium, thus reducing or eliminating the ability to record additional holographic gratings therein.

The present invention solves these "dark reaction" problems by deliberately controlling and substantially retarding, reducing, diminishing, eliminating, etc., the further polymerization of the residual unpolymerized photoactive material when the photoinitiating light source is off or absent. In addition to preserving the previously recorded pattern of holographic gratings in the medium for reliable retrieval of the recorded data, the present invention can also: (1) preserve more of the remaining dynamic range of the medium for recording additional holographic gratings; (2) record holographic gratings in the medium according to a more easily managed schedule, e.g., one that is a substantially linear function of when the holographic recording medium is exposed to the recording light versus the time period of each exposure to the recording light; (3) determine more accurately the time needed for recording additional holographic gratings in the same volume of a previously recorded medium, up to the full dynamic range thereof; and (4) in general, to create a more commercially viable high density holographic data storage medium.

FIG. 1 illustrates the basic components of a holographic system 10. System 10 contains a modulating device 12, a photorecording medium 14, and a sensor 16. Modulating device 12 is any device capable of optically representing data in two-dimensions. Device 12 is typically a spatial light modulator that is attached to an encoding unit that encodes data onto the modulator. Based on the encoding, device 12 selectively passes or blocks portions of a signal beam 20 passing through device 12. In this manner, beam 20 is encoded with a data image. The image is stored by interference of the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location, or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase at which reference beam 22 was directed during storage of the data. The reconstructed data passes through lens 34 and is detected by sensor 16. Sensor 16 is, for example, a charge coupled device or an active pixel sensor. Sensor 16 typically is attached to a unit that decodes the data.

As discussed above, formation of a hologram, waveguide, or other optical article relies on a refractive index contrast (Δn) between exposed and unexposed regions of a medium, this contrast being at least partly due to monomer/oligomer diffusion to exposed regions. High index contrast is generally desired because it provides improved signal strength when reading a hologram, and provides efficient confinement of an optical wave in a waveguide. One way to provide high index contrast in the invention is to use a photoactive monomer/oligomer having moieties (referred to as index-contrasting moieties) that are substantially absent from the support matrix, and that exhibit a refractive index substantially different from the index exhibited by the bulk of the support matrix. For example, high contrast may be obtained by using a support matrix that contains primarily aliphatic or saturated alicyclic moieties with a low concentration of heavy atoms and conjugated double bonds (providing low index) and a photoactive monomer/oligomer made up primarily of aromatic or similar high-index moieties.

A holographic recording medium of the present invention is formed such that holographic writing and reading to the medium are possible. Typically, fabrication of the medium involves depositing a combination, blend, mixture, etc., of the support matrix/polymerizable component/photoinitiator component, as well as any composition, compound, molecule, etc., used to control or substantially reduce the rate of polymerization in the absence of a photoinitiating light source according to the present invention (e.g., polymerization retarder), between two plates using, for example, a gasket to contain the mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. In applications requiring optical flatness, the liquid mixture may shrink during cooling (if a thermoplastic) or curing (if a thermoset) and thus distort the optical flatness of the article. To reduce such effects, it is useful to place the article between plates in an apparatus containing mounts, e.g., vacuum chucks, capable of being adjusted in response to changes in parallelism and/or spacing. In such an apparatus, it is possible to monitor the parallelism in real-time by use of conventional interferometric methods, and to make any necessary adjustments to the heating/cooling process. Additionally, an article or substrate of the present invention may have an antireflective coating and/or be edge sealed to exclude water and/or oxygen. An antireflective coating may be deposited on an article or substrate by various processes such as chemical vapor deposition and an article or substrate may be edge sealed using known methods. The photorecording material of the present invention is also capable of being supported in other ways. More conventional polymer processing is also envisioned, e.g., closed mold formation or sheet extrusion. A stratified medium is also contemplated, i.e., a medium containing multiple substrates, e.g., glass, with layers of photorecording material disposed between the substrates.

Because the article of the present invention can, in some embodiments, exhibit thermoplastic properties, an article of the present invention may also be heated above its melting temperature and processed in the ways described above for the combination, blend, mixture, etc., of the support matrix/polymerizable component/photoinitiator component/polymerization retarder.

A holographic recording medium of the present invention is then capable of being used in a holographic system such as discussed previously. The amount of information capable of being stored in a holographic medium is proportional to the product of: the refractive index contrast, Δn, of the photorecording material, and the thickness, d, of the photorecording material. (The refractive index contrast, Δn, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wave vector, and $n_0$ is the baseline refractive index of the medium. See, e.g., P. Hariharan, Optical Holography: Principles, Techniques and Applications, Cambridge University Press, Cambridge, 1991, at 44, the disclosure of which is hereby incorporated by reference.) The Δn of a material is typically calculated from the diffraction efficiency or efficiencies of a single volume hologram or a multiplexed set of volume holograms recorded in a medium. The Δn is associated with a medium before writing, but is observed by measurement performed after recording. Advantageously, the photorecording material of the invention exhibits a Δn of $3 \times 10^{-3}$ or higher.

Examples of other optical articles include beam filters, beam steerers or deflectors, and optical couplers. (See, e.g., L. Solymar and D. Cooke, Volume Holography and Volume Gratings, Academic Press, 315-327 (1981), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travels undeflected through the hologram. (See, e.g., J. E. Ludman et al., "Very thick holographic nonspatial filtering of laser beams," Optical Engineering, Vol. 36, No. 6, 1700 (1997), the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Media for these holographic optical elements are capable of being formed by the techniques discussed herein for recording media or waveguides.

As mentioned previously, the materials principles discussed herein are applicable not only to hologram formation, but also to formation of optical transmission devices such as waveguides. Polymeric optical waveguides are discussed for example in B. L. Booth, "Optical Interconnection Polymers," in Polymers for Lightwave and Integrated Optics, Technology and Applications, L. A. Hornak, ed., Marcel Dekker, Inc. (1992); U.S. Pat. No. 5,292,620 (Booth et al.), issued Mar. 18, 1994; and U.S. Pat. No. 5,219,710 (Horn et al.), issued Jun. 15, 1993, the disclosures of which are hereby incorporated by reference. Essentially, the recording material of the present invention is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. This process is discussed for example at pages 235-36 of Booth, supra, and Cols. 5 and 6 of U.S. Pat. No. 5,292,620, supra, the disclosure of which is hereby incorporated by reference.

In one embodiment of the present invention using conventional molding techniques, it is possible to mold the combination, blend, mixture, etc., of the support matrix/polymerizable component/photoinitiator component/polymerization retarder into a variety of shapes prior to formation of the article by cooling to room temperature. For example, the combination, blend, mixture, etc., of the support matrix/polymerizable component/photoinitiator component/polymerization retarder can be molded into ridge waveguides, wherein a plurality of refractive index patterns are then written into the molded structures. It is thereby possible to easily form structures such as Bragg gratings. This feature of the present invention increases the breadth of applications in which such polymeric waveguides would be useful.

In one embodiment, the support matrix is thermoplastic and allows an article of the present invention to behave as if the entire article was a thermoplastic. That is, the support matrix allows the article to be processed similar to the way that a thermoplastic is processed, i.e., molded into a shaped article, blown into a film, deposited in liquid form on a substrate, extruded, rolled, pressed, made into a sheet of material, etc. and then allowed to harden at room temperature to take on a stable shape or form. The support matrix may comprise one or more thermoplastics. Suitable thermoplastics include poly (methyl vinyl ether-alt-maleic anhydride), poly(vinyl acetate), poly(styrene), poly(propylene), poly(ethylene oxide), linear nylons, linear polyesters, linear polycarbonates, linear polyurethanes, poly(vinyl chloride), poly(vinyl alcohol-co-vinyl acetate).

In one embodiment of the present invention, the amount of thermoplastic used in the holographic recording medium of the present invention is preferably enough that the entire holographic recording medium effectively acts as a thermoplastic for most processing purposes. The binder component of the holographic recording medium may make up as much as about 5%, preferably as much as about 50%, and more preferably as much as about 90% of the holographic recording medium by weight. The amount of any given support matrix in the holographic recording medium may vary based on clarity, refractive index, melting temperature, $T_g$, color, birefringence, solubility, etc. of the thermoplastic or thermoplastics that make up the binder component. Additionally, the amount of the support matrix in the holographic recording medium may vary based on the article's final form, whether it is a solid, a flexible film, or an adhesive.

In one embodiment of the present invention, the support matrix may include a telechelic thermoplastic resin—meaning that the thermoplastic polymer may be functionalized with reactive groups that covalently crosslink the thermoplastic in the support matrix with the polymer formed from the polymerizable component during grating formation. Such crosslinking makes the gratings stored in the thermoplastic holographic recording medium very stable, even to elevated temperatures for extended periods of time.

Similarly, in another embodiment of the present invention wherein a thermoset is formed, the matrix may contain functional groups that copolymerize or otherwise covalently bond with the monomer used to form the photopolymer. Such matrix attachment methods allow for increased archival life of the recorded holograms. Suitable thermoset systems for used herein are disclosed in to U.S. Pat. No. 6,482,551 (Dhar et al.), which is incorporated here by reference.

In another embodiment of the present invention, the thermoplastic support matrix becomes crosslinked noncovalently with the polymer formed upon grating formation by using a functionalized thermoplastic polymer in the support matrix. Examples of such non-covalent bonding include ionic bonding, hydrogen bonding, dipole-dipole bonding, aromatic pi stacking, etc.

According to an embodiment of the present invention, the polymerizable component of an article of the present invention includes at least one photoactive polymerizable material that can form holographic gratings made of a polymer or co-polymer when exposed to a photoinitiating light source, such as a laser beam that is recording data pages to the holographic recording medium. The photoactive polymerizable materials can include any monomer, oligomer, etc., that is capable of undergoing photoinitiated polymerization, and which, in combination with the support matrix, meets the compatibility requirements of the present invention. Suitable photoactive polymerizable materials include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether/maleimide, vinyl ether/thiol, acrylate/thiol, vinyl ether/hydroxy, etc., are also suitable. It is also possible to use cationically polymerizable systems; a few examples are vinyl ethers, alkenyl ethers, allene ethers, ketene acetals, epoxides, etc. Furthermore, anionic polymerizable systems are suitable. It is also possible for a single photoactive polymerizable molecule to contain more than one polymerizable functional group. Other suitable photoactive polymerizable materials include cyclic disulfides and cyclic esters. Oligomers that may be included in the polymerizable component to form a holographic grating upon exposure to a photoinitiating light source include oligomers such as oligomeric (ethylene sulfide) dithiol, oligomeric (phenylene sulfide) dithiol, oligomeric (bisphenol A), oligomeric (bisphenol A) diacrylate, oligomeric polyethylene with pendent vinyl ether groups, etc. The photoactive polymerizable material of the polymerizable component of an article of the present invention may be monofunctional, difunctional, and/or multifunctional.

In addition to the at least one photoactive polymerizable material, an article of the present invention may contain a photoinitiator. The photoinitiator, upon exposure to relatively low levels of the recording light, chemically initiates the polymerization of the at least one photoactive polymerizable material, thus avoiding the need for direct light-induced polymerization. The photoinitiator generally should offer a source of species that initiate polymerization of the particular photoactive polymerizable material, e.g., photoactive monomer. Typically, from about 0.1 to about 20 vol. % photoinitiator provides desirable results.

A variety of photoinitiators known to those skilled in the art and available commercially are suitable for use in the present invention, for example, those comprising a phosphine oxide group, such as diphenyl(2,4,6-trimethylbenzoyl)phosphine oxide, disclosed in U.S. Pat. No. 6,780,546 (Trentler et al.), issued Aug. 24, 2004, which is hereby incorporated by reference. It is advantageous to use a photoinitiator that is sensitive to light at wavelengths available from conventional laser sources, e.g., the blue and green lines of $Ar^+$ (458, 488, 514 nm) and He—Cd lasers (442 nm), the green line of frequency doubled YAG lasers (532 nm), and the red lines of He—Ne (633 nm), $Kr^+$ lasers (647 and 676 nm), and various diode lasers (290 to 900 nm). One advantageous free radical photoinitiator is bis($\eta$-5-2,4-cyclopentadien-1-yl)bis[2,6-difluoro-3-(1H-pyrrol-1-yl)phenyl]titanium, available commercially from Ciba as Irgacure 784™. Another visible free-radical photoinitiator (which requires a co-initiator) is 5,7-diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. In the case of cationically polymerizable components, a cationic photoinitiator is used, such as a sulfonium salt or an iodonium salt. These cationic photoinitiator salts absorb predominantly in the UV portion of the spectrum, and are therefore typically sensitized with a sensitizer or dye to allow use of the visible portion of the spectrum. An example of an alternative visible cationic photoinitiator is ($\eta_5$-2,4-cyclopentadien-1-yl) ($\eta_6$-isopropylbenzene)-iron(II) hexafluorophosphate, available commercially from Ciba as Irgacure 261.

In most embodiments, photoinitiators of the present invention are sensitive to ultraviolet and visible radiation of from about 200 nm to about 800 nm.

An article of the present invention may also include additives such as plasticizers for altering the properties of the article of the present invention including the melting point, flexibility, toughness, diffusibility of the monomers, and ease of processibililty. Examples of suitable plasticizers include dibutyl phthalate, poly(ethylene oxide) methyl ether, N,N-dimethylformamide, etc. Plasticizers differ from solvents in that solvents are typically evaporated whereas plasticizers are meant to remain in the article.

Other types of additives that may be used in the liquid mixture and article of the present invention are inert diffusing agents having relatively high or low refractive indices. Inert diffusing agents typically diffuse away from the grating being formed, and can be of high or low refractive index but are typically low. Thus, when the monomer is of high refractive index, the inert diffusing agent would be of low refractive index, and ideally the inert diffusing agent diffuses to the nulls in an interference pattern. Overall, the contrast of the grating is increased. Other additives that may be used in the liquid mixture and article of the present invention include: pigments, fillers, nonphotoinitiating dyes, antioxidants, bleaching agents, mold releasing agents, antifoaming agents, infrared/microwave absorbers, surfactants, adhesion promoters, etc.

Although in one embodiment, the polymerizable component of an article of the present invention is less than about 20 volume %, in other embodiments, the polymerizable component of an article of the present invention may be less than about 10 volume %, or even less than about 5 volume %. For data storage applications, the typical polymerizable component is present at about 5 volume %.

An article of the present invention may be any thickness needed. For example the article may be thin for display holography or thick for data storage. The article may be a film deposited on a substrate, a free flexible film (similar to food wraps) or a hard article requiring no substrate (similar to a credit card). For data storage applications, the article will typically be from about 1 to about 1.5 mm in thickness, and is typically in the form of a film deposited between two substrates with at least one of the substrates having an antireflective coating; the article would also likely be sealed against moisture and air.

An article of the present invention may be heated to form a liquid mixture that is infused into a porous substrate such as glass (Vycor™), cloth and paper, wood or plastic; then allowed to cool. Such articles would be able to record holograms of a display and/or data nature.

An article of the present invention may be made optically flat via the appropriate processes, such as the process described in U.S. Pat. No. 5,932,045 (Campbell et al.), issued Aug. 3, 1999, the entire contents and disclosure of which is hereby incorporated by reference.

Also, the ability to choose between a wide variety of matrix types in an article of the present invention allows for the possible reduction or elimination of problems such as water or humidity that affect current holographic storage media. In one embodiment, the article of the present invention may be used to store volatile holograms. Due to the ability to control the photopolymer chain length in the present invention, a particular mixture may be tuned to have a very general lifetime for the recorded holograms. Thus, after hologram recording, the holograms may be readable for a defined time period such as a week, a few months, or years. Heating the article may also increase such a process of hologram destruction. Examples of applications for using volatile holograms include: rental movies, security information, tickets (or season passes), thermal history detector, time stamp, and/or temporary personal records, etc.

In one embodiment, an article of the present invention may be used to record permanent holograms. There are several methods to increase the permanency of recorded holograms. Many of these methods involve placing functional groups on the matrix that allow for the attachment of photopolymer to the matrix during cure. The attachment groups can be vinyl unsaturations, chain transfer sites, or even a polymerization retarder such as a BHT derivative. Otherwise, for increased archival stability of recorded holograms, a multifunctional monomer should be used which allows for crosslinking of the photopolymer, thus increasing the entanglement of the photopolymer in the matrix. In one embodiment of the present invention, both a multifunctional monomer and a matrix-attached retarder are used. In this way, the shorter chains that are caused by the polymerization retarder do not cause loss of archival life.

In addition to the photopolymeric systems described above, various photopolymeric systems may be used in the holographic recording medium of the present invention. For example, suitable photopolymeric systems for use in the present invention are also described in: U.S. Pat. No. 6,103,454 (Dhar et al.), U.S. Pat. No. 6,482,551 (Dhar et al.), U.S. Pat. No. 6,650,447 (Curtis et al.), U.S. Pat. No. 6,743,552 (Setthachayanon et al.), U.S. Pat. No. 6,765,061 (Dhar et al.), U.S. Pat. No. 6,780,546 (Trentler et al.), U.S. Patent Application No. 2003-0206320, published Nov. 6, 2003, (Cole et al), and U.S. Patent Application No. 2004-0027625, published Feb. 12, 2004.

An article of the present invention may be ground, shredded, fragmented, etc. to form a particle material of powder, chips, etc. The particle material may be heated at a later time to form a flowable liquid used to make a molded product, a coating to apply to a substrate, etc.

When the particle material is a powder, the powder may be electrostatically applied to a substrate such as metal and other conductive materials (typical powder coating), which would then be heated to form a coating. The powder may also be infused into fibrous materials to form holographic paper, cardboard, ribbons, etc. for decorative applications. Additionally, the powder may be melt extruded into a fiber for thread, yarn, and fabric applications.

An article of the present invention may also be used for decorative purposes. For example, the article may be used in gift wrap or in window treatments to provide special artistic tinting or 3D designs. The article may be ground-up and used in coatings such as paint for houses, automobiles, furniture, etc. The article may be used in molded parts of automobiles, toys, furniture, appliances, etc. to provide decorative effects.

An article of the present invention may also be used to make data storage devices of various sizes and shapes, as a block of material or as part of a coating that is coated on a substrate.

The present invention is particularly directed at controlling photopolymerization reactions in the holographic recording medium, and especially in reducing, minimizing, diminishing, eliminating, etc., dark reactions in the photopolymeric systems used in such a holographic recording medium. This is typically achieved by using one or more of the following: (1) a polymerization retarder; (2) a polymerization inhibitor; (3) a chain transfer agent; (4) use of metastable reactive centers; (5) use of light or heat labile phototerminators; (6) use of photo-acid generators, photo-base generators or photogenerated radicals; (7) use of polarity or solvation effects; (8) counter ion effects; and (9) changes in photoactive polymerizable material reactivity.

For free radical systems, the kinetics of photopolymerization reactions are dependent on several variables such as monomer/oligomer concentration, monomer/oligomer functionality, viscosity of the system, light intensity, photoinitiator type and concentration, the presence of various additives (e.g., chain transfer agents, inhibitors), etc. Thus, for free radical photopolymerization the following steps typically describe the mechanism for formation of the photopolymer:

$hv + PI \rightarrow 2R*$ (initiation reaction)     1)

$R* + M \rightarrow M*$ (initiation reaction)     2)

$M* + M \rightarrow (M)_2*$ (propagation reaction)     3)

$(M)_2* + M \rightarrow (M)_3*$ (propagation reaction)     4)

$(M)_n* + M \rightarrow (M)_{n+1}*$ (propagation reaction)     5)

$R* + M* \rightarrow RM$ (termination reaction)     6)

$(M)_n* + (M)_m* \rightarrow (M)_{n+m}$ (termination reaction)     7)

$R* + (M)_m* \rightarrow R(M)_m$ (termination reaction)     8)

$R* + R* \rightarrow RR$ (termination reaction)     9)

The rate of photoinitiation can be described by the following equation 10):

$R_i = n*\Phi*I_a = n*\psi*\epsilon*I_o*[A]*b$     10)

wherein $R_i$ is the rate of initiation, n is the number of radicals generated by the photoinitiator (n=2 for many free radical initiators, n=1 for many cationic initiators), $\Phi$ is the quantum yield for initiation (typically less than 1), $I_a$ is the intensity of absorbed light in Einsteins, $I_o$ is incident light intensity (also in Einsteins), A is the concentration of photoinitiator (moles/liter), $\epsilon$ is the molar absorptivity of the initiator at the wavelength of interest, and b is the thickness of the system (cm).

The rate of initiation determines the rate of polymerization according to the following equation 11):

$$R_p = k_p[M]\left(\frac{\Phi\epsilon I_o[A]b}{k_t}\right)^{1/n} \quad\quad 11)$$

wherein $R_p$ is the rate of polymerization, $k_p$ is the kinetic rate constant for polymerization, M is monomer concentration, and $k_t$ is the kinetic rate constant for termination.

Equation 11) assumes that the light intensity does not vary appreciably through the medium. The quantum efficiency of initiation for free radical photoinitiators is greatly affected by monomer concentration, viscosity, and rate of initiation when monomer concentration is below 0.1 M, which is typically the regime for a two-component type photopolymer holographic medium. Thus, the following dependencies are found to decrease the quantum yield for initiation: higher viscosities, lower monomer concentration, and higher initiation rates (from increased intensity, higher molar absorptivity, etc.).

However, when a polymerization retarder/inhibitor is added, the reactions 12) and 13) below can occur (where X* represents any radical):

$X* + Z-Y \rightarrow X-Y + Z$ (termination reaction)     12)

$Z* + X* \rightarrow Z-X$ (termination reaction)     13)

Assuming that transfer to the retarder/inhibitor is high relative to other termination reactions, the kinetic equation 11) changes to the following equation 14):

$$R_p = k_p[M]\left(\frac{\Phi\epsilon I_o[A]b}{k_z[Z]}\right) \quad\quad 14)$$

wherein Z is the concentration of the inhibitor and $k_z$ is the termination with retarder/inhibitor rate constant. The polymerization rate shown in equation 14) is dependent on the $1^{st}$ power of the initiation rate ($R_i$). The ratio of $k_z/k_p$ is referred to as the inhibitor constant (i.e., lower case z). Values much greater than about 1 represent an inhibitory effect, whereas values of about 1 or less represent retarding effects. Values much less than about 1 represent little effect on the polymerization rate.

The difference between a polymerization inhibitor and a polymerization retarder frequently depends on the particular polymerizable component involved. For example, nitrobenzene only mildly retards radical polymerization of methyl acrylate, yet, nitrobenzene inhibits radical polymerization of vinyl acetate. Thus, it is possible to find agents that are typically considered as inhibitors that would also function as retarders for the purposes of the present invention. See the following table which shows some illustrative inhibitor constants z for various polymerization retarders/inhibitors with various polymer systems:

|  | Vinyl Acetate | Acrylonitrile | Methyl Acrylate | Methyl Methacrylate | Styrene |
| --- | --- | --- | --- | --- | --- |
| Nitrobenzene | 10 |  | 0.005 |  | 0.3 |
| p-Benzoquinone |  | 1 |  | 6 | 500 |
| Chloranil |  |  | 0.3 |  | 2000 |
| FeCl$_3$ |  | 3 |  |  | 540 |
| CuCl$_2$ |  | 100 |  | 1000 | 10,000 |
| Aniline | 0.015 | 0.004 | 0.0001 | 0.0004 | 0.0002 |
| Phenol | 0.012 |  | 0.0002 | 0.0003 | 0.0008 |
| p-Dihydroxybenzene | 1 |  |  |  |  |
| 2,4,6-trimethylphenol | 0.5 |  |  |  |  |
| Triethylamine | 0.04 | 3 | 0.04 | 0.0002 | 0.0004 |
| p-cresol | 0.07 |  |  |  | 0.002 |

Suitable polymerization retarders and inhibitors for use herein include but are not limited to one or more of the following: for free radical polymerizations, various phenols including butylated hydroxytoluenes (BHT) such as 2,6-di-t-butyl-p-cresol, p-methoxyphenol, diphenyl-p-benzoquinone, benzoquinone, hydroquinone, pyrogallol, resorcinol, phenanthraquinone, 2,5-toluquinone, benzylaminophenol, p-dihydroxybenzene, 2,4,6-trimethylphenol, etc.; various nitrobenzenes including o-dinitrobenzene, p-dinitrobenzene, m-dinitrobenzene, etc.; N-phenyl-1-naphthylamine, N-phenyl-2-naphthylamine, cupferron, phenothiazine, tannic acid, p-nitrosamine, chloranil, aniline, hindered anilines, ferric chloride, cupric chloride, triethylamine, etc. These polymerization retarders and inhibitors can be used individually (i.e., a single retarder) or in combinations of two or more, i.e., a plurality of retarders. Although the table above illustrates retarders and inhibitors for radical polymerization, the same principles can be applied to ionic polymerizations. For example, it is known that chloride anions can behave as retarders or inhibitors for cationic polymerizations, depending on both the monomer type and the concentration of the chloride anions. Typically, functionalities that are basic or mildly nucleophilic behave as retarders and inhibitors for cationic polymerizations; whereas for anionic polymerizations, slightly acidic and mildly electrophilic functionalities behave as retarders and inhibitors.

Polymerization reactions involving both polymerization retarders and inhibitors should lead to termination reactions. If reinitiation occurs to any appreciable degree, then the agent is typically considered a chain transfer agent. For example, triethylamine can be used as a chain transfer agent since it is also capable of reinitiating some radical polymerizations; however, when the reinitiation is slow compared to termination reactions, then even chain transfer agents can be considered potential polymerization retarders or inhibitors for the purposes of the present invention.

Suitable chain transfer agents for use herein include but are not limited to: triethylamine, thioethers, compounds having carbonate groups, ethers, toluene derivatives, allyl ethers, etc. Chain transfer agents that are mildly retarding can be desirable because these can be incorporated into the matrix and enable attachment of the photopolymer and photoinitiator radicals to the matrix.

Figure 2:
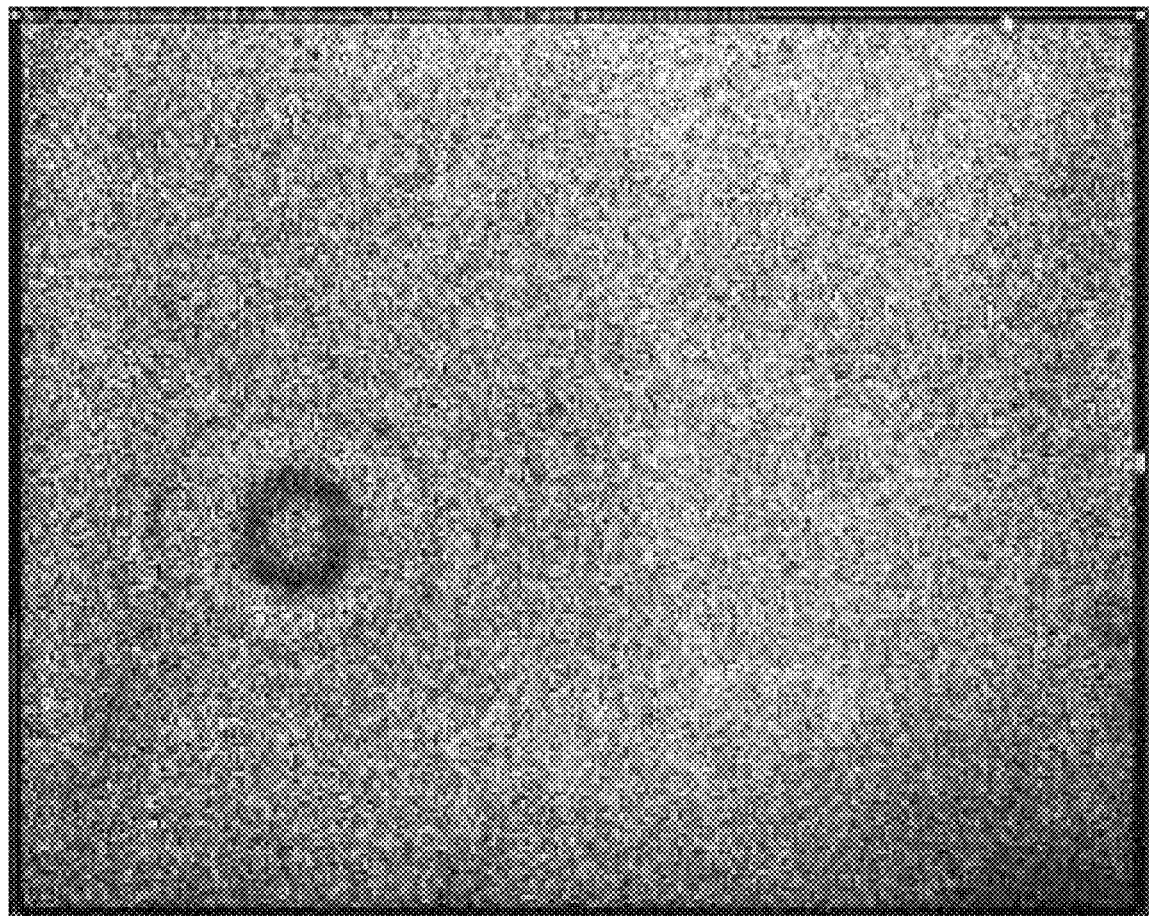
FIG. 2 is an image of a single holographic data page recorded in a two-component photopolymerization medium that contains residual unpolymerized monomer and unused photoinitiator.
Figure 3:
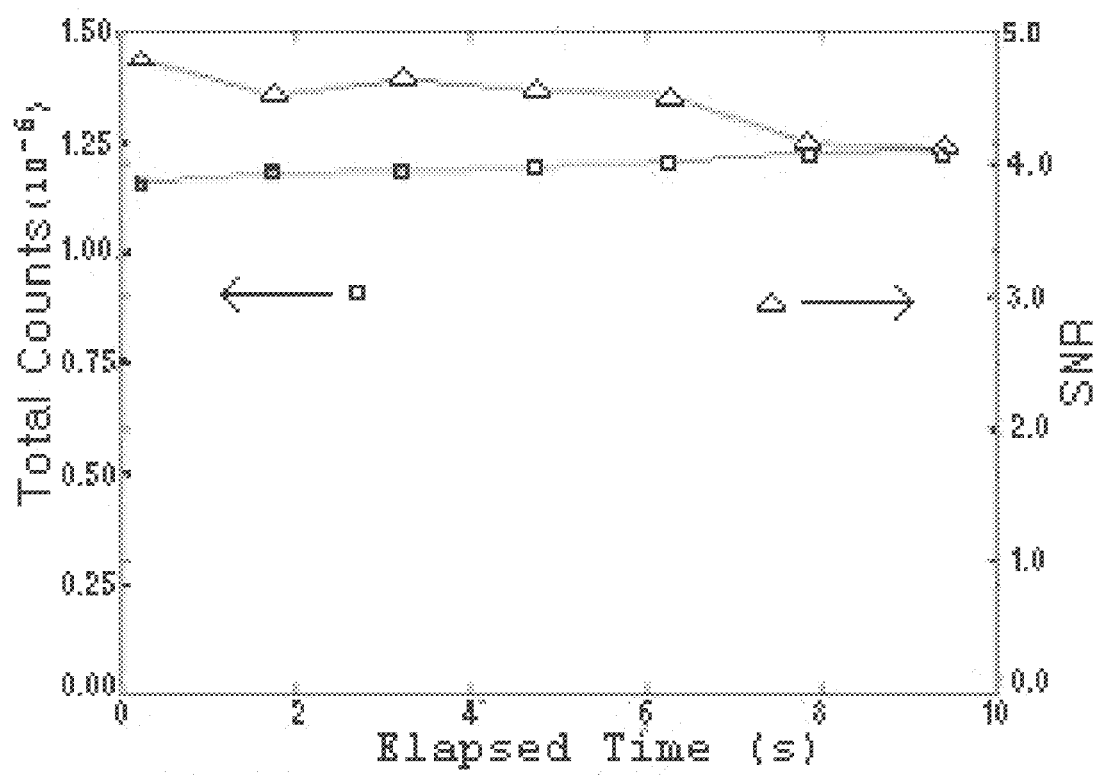
FIG. 3 shows two graphical plots, one of the light intensity in total counts per millisecond recorded, the other of the signal to noise ratio (SNR), as a function of elapsed time, for the data page of FIG. 2.
Figure 4:
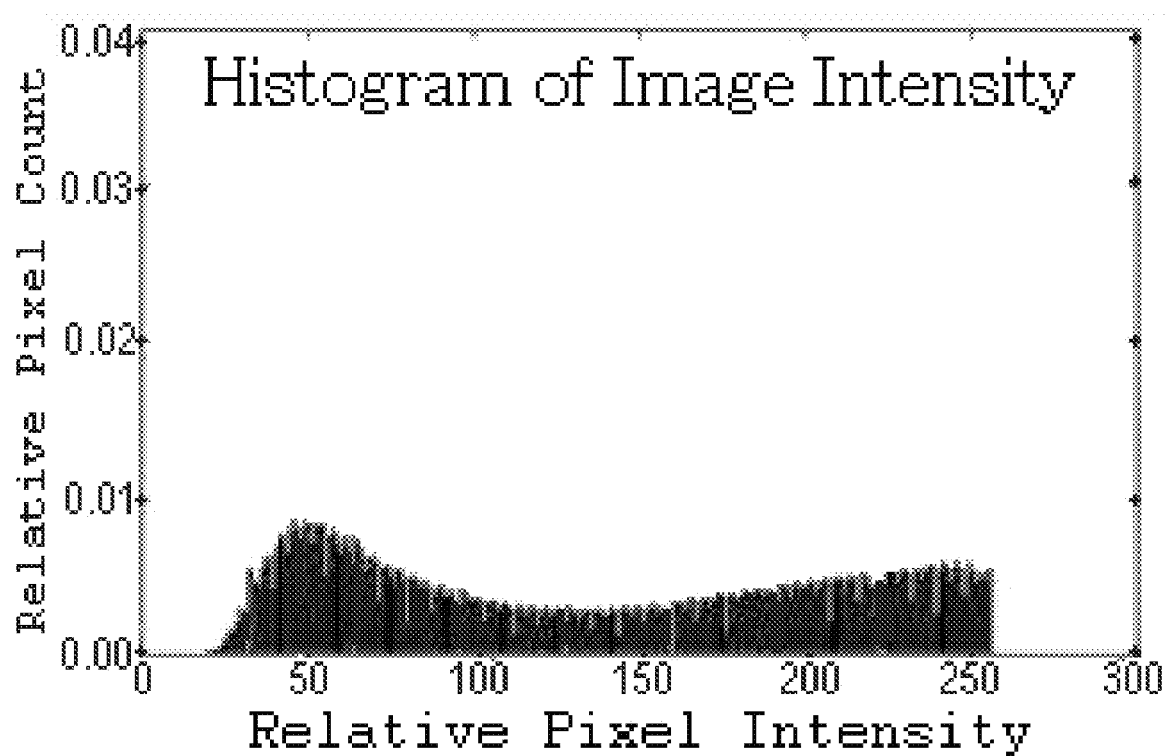
FIG. 4 is a histogram showing the relative fraction of pixels having a particular light intensity for the data page of FIG. 2.
Figure 5:
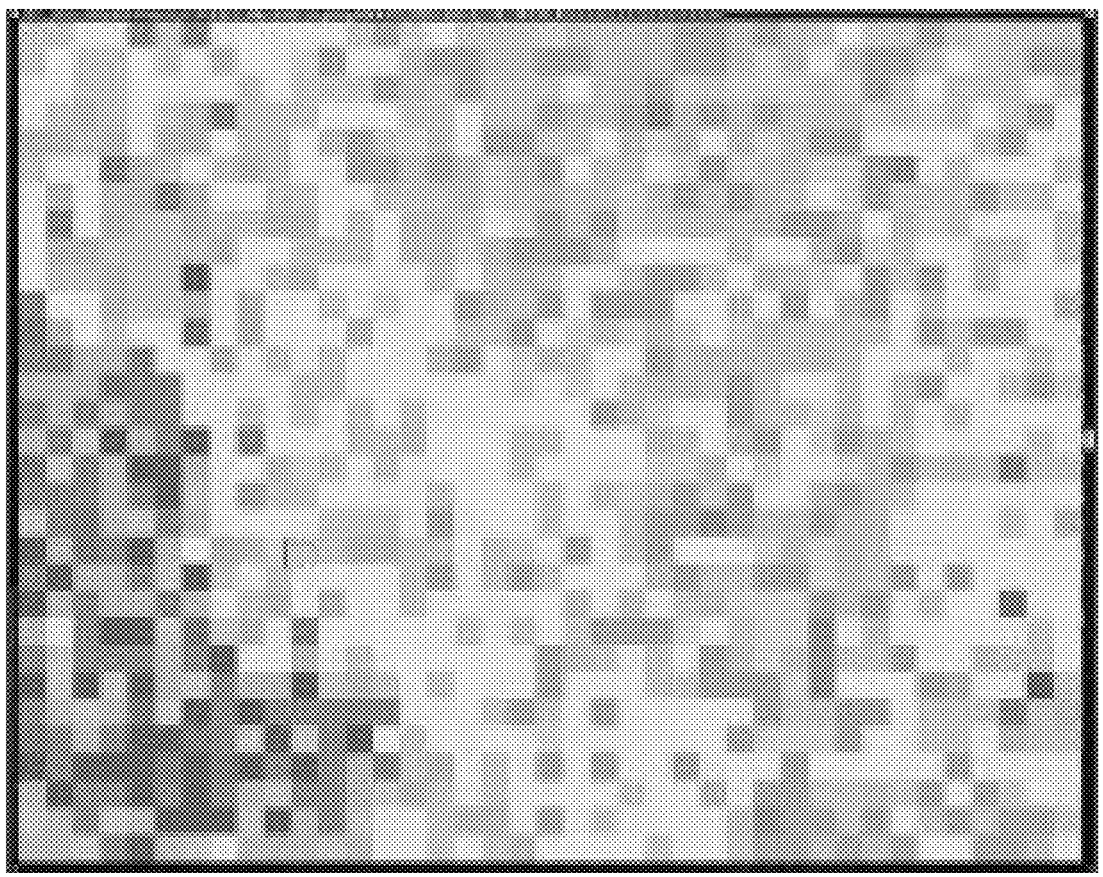
FIG. 5 is an image mapping the local signal to noise ratio (SNR) for the data page of FIG. 2, (8×8 data blocks)

FIGS. 2 through 8 show the time dependent building of noise gratings in a radical photopolymer holographic medium that contains minimal polymerization retarders/inhibitors. FIGS. 2 through 5 relate to a single holographic data page recorded in a two-component radical photopolymer medium. As shown in FIG. 2, a high fidelity data page is recorded in the medium. This is further demonstrated by the graphical plots of light intensity (in total counts per millisecond recorded) and signal to noise ratio (SNR) as a function of elapsed time in FIG. 3, the histogram of the relative fraction of pixels having a particular light intensity in FIG. 4, and the mapping of the SNR of FIG. 5.

Figure 6:
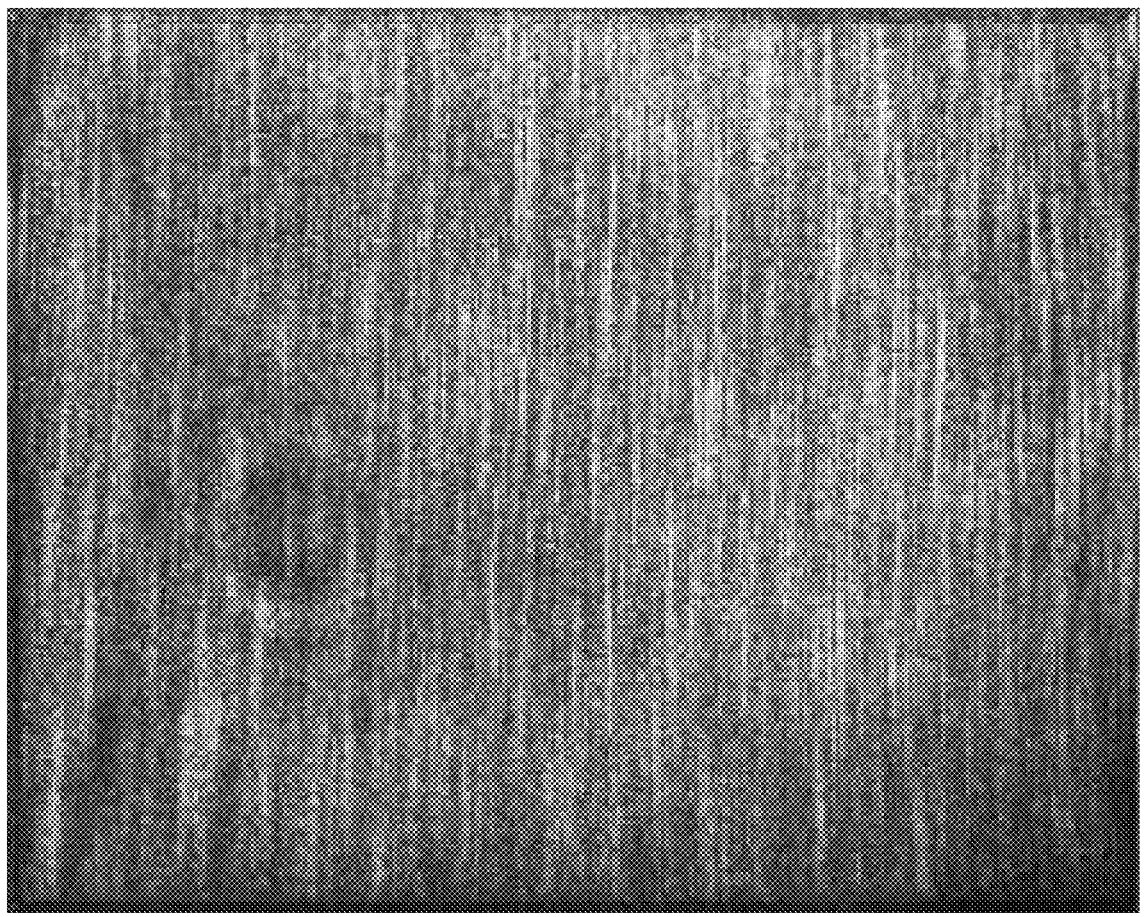
FIG. 6 is an image of the holographic data page of FIG. 2 after being in the dark (i.e., without exposure to recording light) for 60 minutes.
Figure 7:
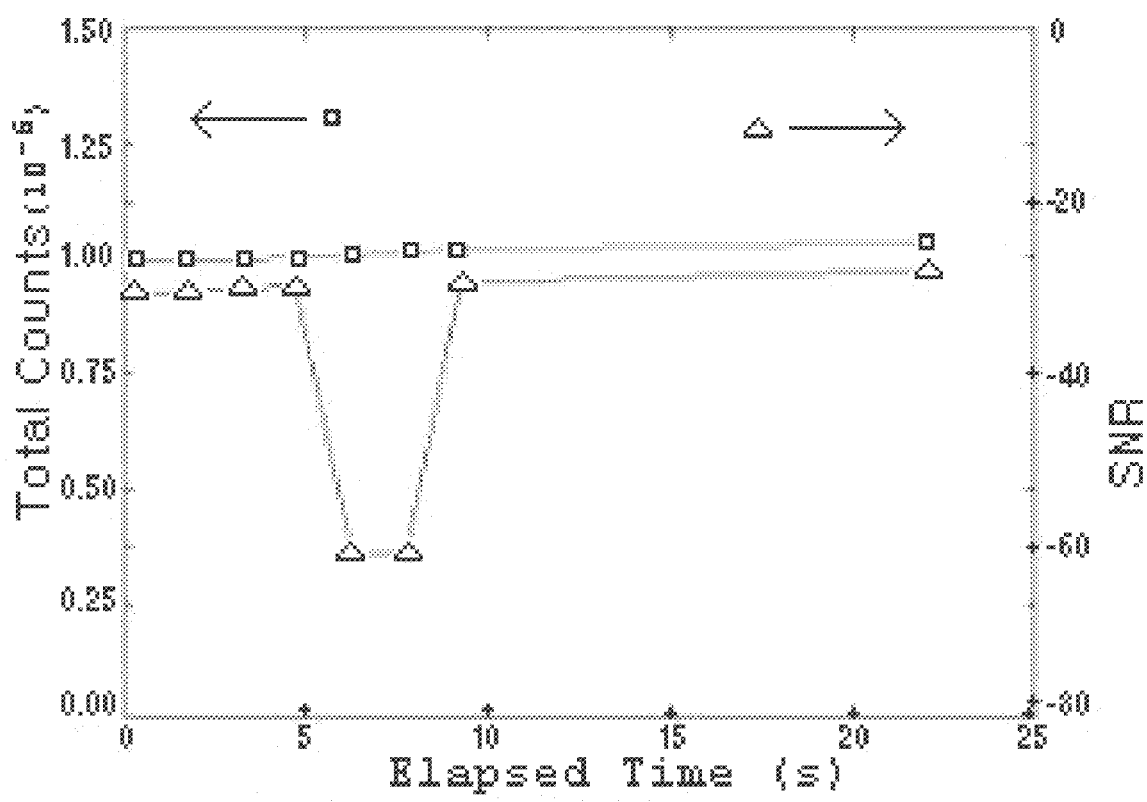
FIG. 7 shows two graphical plots, one of the light intensity in total counts per millisecond recorded, the other of the signal to noise ratio (SNR), as a function of elapsed time, for the data page of FIG. 6.
Figure 8:
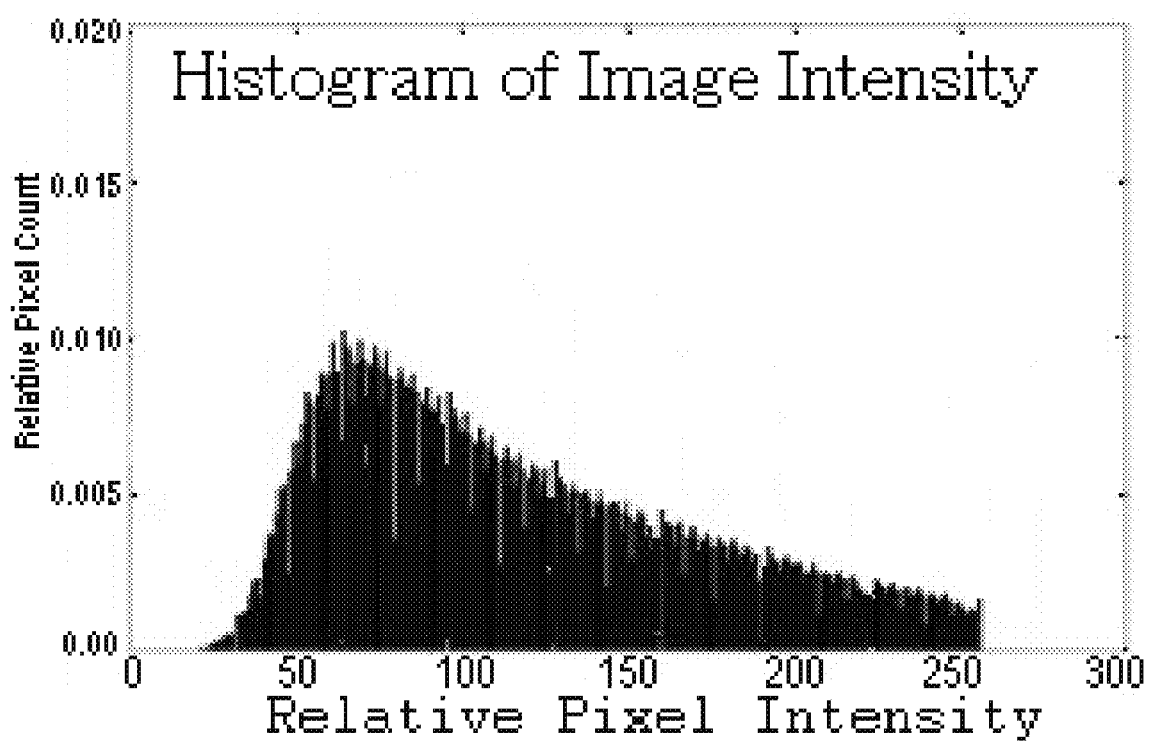
FIG. 8 is a histogram showing the relative fraction of pixels having a particular light intensity for the data page of FIG. 6.

FIGS. 6 through 8 represent the same medium in the dark and 60 minutes after the recording shown in FIG. 2. As shown in FIG. 6, the medium has developed noise gratings that have grown and eventually obscured the previously recorded data, due to the occurrence of "dark reactions." This degrading of the recorded data in FIG. 6 is further demonstrated by the graphical plots of light intensity (in total counts per millisecond recorded) and signal to noise ratio (SNR) as a function of elapsed time in FIG. 7, and the histogram of the relative fraction of pixels having a particular light intensity in FIG. 8. Indeed, if the SNR were mapped as in FIG. 5, it would show very little difference in light intensity over the entire data page of FIG. 6.

Figure 9:
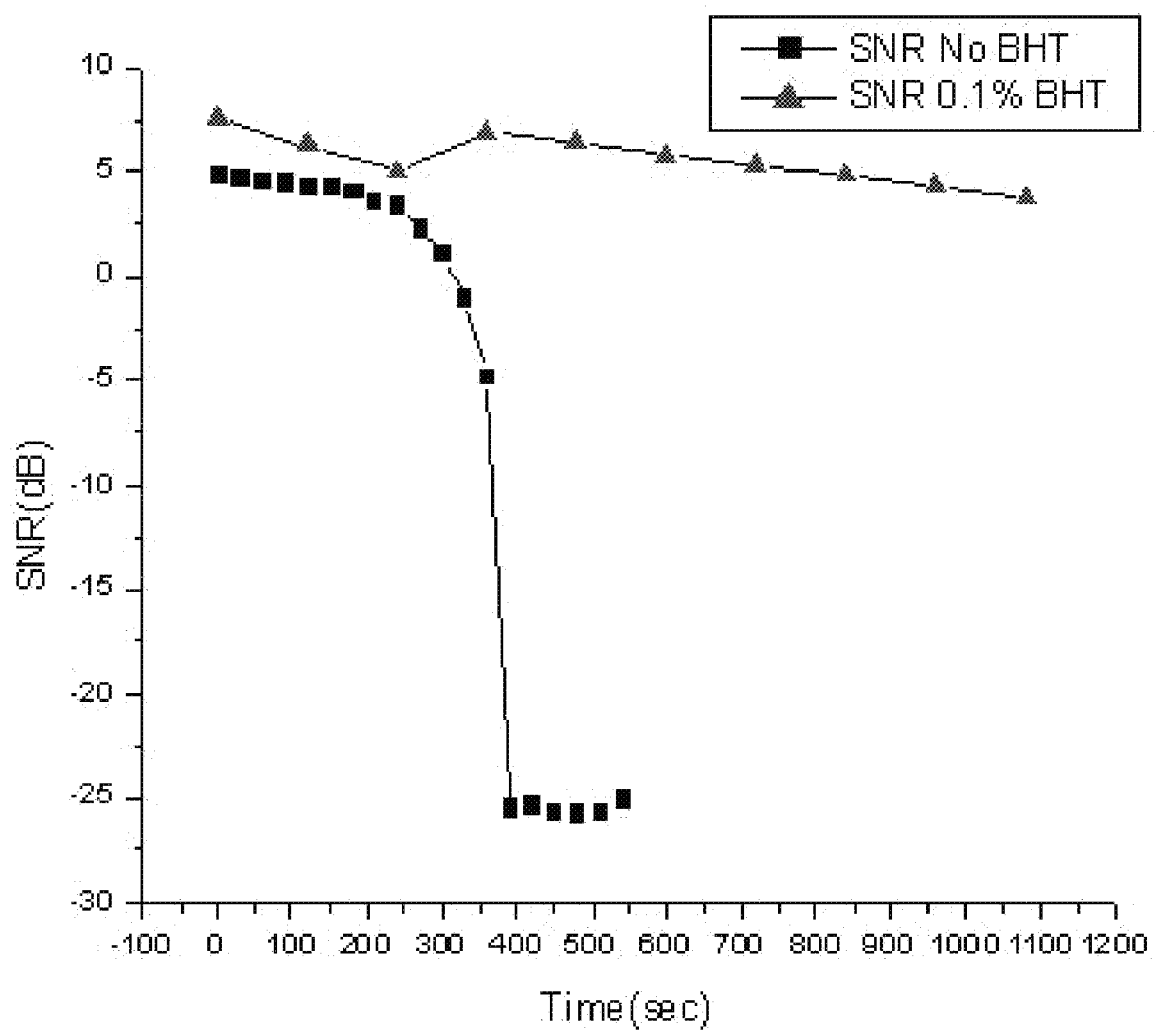
FIG. 9 shows two graphical plots of the signal to noise ratio (SNR) of a data page as a function of time, one with no polymerization retarder/inhibitor added, the other with 0.1% of a polymerization retarder/inhibitor (BHT) added.

The graphical plots in FIG. 9 illustrate what happens when a polymerization retarder such as BHT (2,6-di-t-butyl-p-cresol)) is included in the holographic recording medium according to the present invention in amounts sufficient to retard the polymerization of the photoactive polymerizable monomer when not exposed to a photoinitiating light source. The curve with squares in FIG. 9 represents the addition of no polymerization retarder, while the curve with triangles represents the addition of 0.1% BHT. As shown in FIG. 9, when no polymerization retarder was added, the reconstruction of the recorded page rapidly degraded due to dark reactions, as evidenced by the greater than 30 dB drop in SNR. By contrast, as also shown in FIG. 9, the addition of 0.1% BHT minimized or eliminated noise development due to dark reactions, allowing the recorded page to maintain high fidelity. In other words, the observed time dependent noise gratings of FIG. 6 do not form, allowing for the continued retrieval of high fidelity holographic data. While the concentration of BHT added limits the development of such noise gratings when not exposed to recording light, it still permits the recording of additional holographic gratings in the medium when exposed to recording light. Thus, the addition of an appropriate amount of retarder/inhibitor allows for high fidelity read out of the holographically stored data. Also, since the system is not changing with time after recording the initial hologram(s), further holograms can be recorded without modifying the recording schedule, even if there is a large time period between exposure events.

The use of polymerization retarders versus polymerization inhibitors can be advantageous in the present invention. After the first several exposures in recording multiple holograms, the amount of polymerization inhibitor present in the medium can drastically be reduced. At such low concentrations, dark reactions may again become a problem. Conversely, with the use of a polymerization retarder, only small amounts of the retarder are reacted during any given exposure. Therefore, the concentration of the polymerization retarder can potentially decrease substantially linearly and in correlation to the reduction in monomer concentration. Thus, even late in the exposure schedule, there is enough retarder to prevent both polymerization after an exposure and polymerization in low light intensity areas. Effectively, the polymerization retarder serves as a chain length limiter. Ideally, the ratio of polymerization retarder to polymerizable material (e.g., monomer) stays nearly constant throughout the exposure schedule. In such a scenario, the chain length (degree of polymerization), potentially, stays essentially the same throughout the exposure schedule, leading to a substantially linear response for number of exposures versus time period for each exposure.

The use of retarders/inhibitors/chain transfer agents is not limited to radical polymerizations. Cationic and anionic polymerizations (including ring opening polymerizations) are also subject to dark reactions. Thus, the addition of appropriate inhibitors/retarders/chain transfer agents to these ionic chain polymerizations is also useful in reducing, minimizing, diminishing, eliminating, etc., dark reactions.

In addition to retarders, inhibitors and/or chain transfer agents, metastable reactive centers and light labile phototerminators can also be used to control polymerization reactions according to the present invention of the appropriate reactivity. For example, nitroxyl radicals can be added as a metastable reactive center. Nitroxyl radicals create pseudo-living radical polymerizations with certain monomers. Thus, the nitroxyl radical initially behaves as a terminating agent (such as an inhibitor), however, depending on the temperature at which the polymerization is carried out, the termination is reversible. In such scenarios, one can both limit dark reaction and control chain length by changing the recording temperature. Thus, it is possible to record holograms at an elevated temperature and then cool to room temperature to prevent further polymerizations. Additionally, it is possible to record at room temperature, thus terminating all chains quickly like an inhibitor, and then to heat the sample to enable the addition of new photoactive monomer to all the gratings at the same time. In this other scenario, there is an advantage gained from the polymerization of all gratings occurring at a single time in that Bragg detuning would be uniform for all gratings involved. Other potential metastable reactive center include triphenylmethyl radicals, dithioesters are typically used in Reversible Addition-Fragmentation chain Transfer (RAFT) polymerizations, that can behave as appropriate metastable reactive centers, etc. As for ionic polymerizations, there are stable ions that are able to perform the same function, as the example nitroxyl radicals above.

Use of a light labile phototerminator provides the ability to control the activity of the reactive species with light (as opposed to heat as described above). A light labile phototerminator is any molecule capable of undergoing reversible termination reactions using a light source. For example, certain cobaltoxime complexes can be used to photoinitiate radical polymerizations, and yet, also terminate the same radical polymerizations. Dithioesters are also suitable as light labile phototerminators because they have the ability to reversibly form radicals with appropriate wavelengths of light. Under the appropriate conditions and with appropriate monomers (such as styrenes and acrylates), it is possible to restart the polymerization by irradiating with a photoinitiating light source (e.g., recording light). Thus, as long as a given volume is exposed to a photoinitiating light source, radical polymerization continues, whereas when the photoinitiating light is off or absent, the polymerizations are terminated. Metastable reactive centers and light labile phototerminators can also be used to control ionic (i.e., cationic or anionic initiated) polymerization reaction systems according to the present invention.

Yet another way to reduce, minimize, diminish, eliminate, etc., dark reactions is by the addition or inclusion of a second photoactive compound (i.e., a photo-acid generator, photo-base generator or photo-radical generator) that is activated by a separate wavelength than that used for recording holograms. For instance, if cationic ring opening polymerization is used to record the holograms, then a photo-base generator (PBG) can be used to turn off the cationic species after recording. Thus, after the desired amount of data is recorded in the medium via the first wavelength of light, a second wavelength of light activates the PBG which reacts with most or all of the cationic reactive sites, thus at least minimizing or preventing further cationic ring opening polymerization reactions. A similar concept can be used with anionic and radical polymerizations where photo-acid generators and photogenerated stabilized free radicals are used, respectively. The concept involving a second photoactive compound such as PBGs is typically more useful allowing the recording of some holograms at one time, and, then recording additional holograms in the same volume at a later time until the full dynamic range is used.

For ionic chain reactions (i.e., cationic and anionic initiated polymerization reactions), counter ion and solvent effects can be used to control dark reactions by terminating the reactive center. Ionic systems are sensitive to solvent conditions because the solvent (or the support matrix) determines the proximity of the counter ion to the reactive center. For instance, in a nonpolar medium the counter ion will be very closely associated with the reactive center; in a polar medium the counter ion may become freely dissociated. The proximity of the counter ion can determine polymerization rate as well as the potential for collapse with the counter ion (depending on the counter ion used). For example, if one uses a cationic polymerization with a nonpolar support matrix and chloride anion as the counter ion, there is a better probability of terminating the reaction due to collapse of the counter ion. Thus, in this way, ionic polymerizations can be terminated in a controlled manner, since choice of support matrix and counter ions allows one to determine the likelihood of collapse versus the probability of propagation.

Certain monomer mixtures can also behave in a manner that can control the degree or rate of polymerization. For example, if a small amount of alpha methyl styrene is present in an acrylate polymerization, the acrylate will add into the alpha methyl styrene and the styrene will not substantially reinitiate polymerization of the acrylate, i.e., the alpha methyl styrene retards the rate of acrylate polymerization. Additionally, the alpha methyl styrene is slow to polymerize with itself, and thus behaves as a polymerization retarder/inhibitor even though it is a comonomer. In the case of ionic polymerizations; using, for example, vinyl anisole in a cationic vinyl ether polymerization results in retarded rates of polymerization because the vinyl anisole does not efficiently reinitiate vinyl ether polymerization.

Because of the ability to control and particularly reduce, minimize, diminish, etc., the rate of polymerization reactions in the holographic recording medium when the medium is not exposed to a photoinitiating light source (e.g., recording light), the present invention provides significant advantages in forming at least one holographic grating in the holographic recording medium. These include forming a plurality of holographic gratings in the holographic recording medium, forming one or more additional holographic gratings in the holographic recording medium that has previously formed therein at least one holographic grating at a time period discrete from the time period from when the additional holographic grating(s) is formed (e.g., forming the additional holographic gratings at least about 10 seconds afterwards to about 1 week afterwards), forming the additional holographic gratings in the holographic recording medium in the same volume as the previously formed holographic grating(s), forming each holographic grating in the medium according to a schedule that is a function of when the holographic recording medium was exposed to the recording light versus the time period of each exposure to the recording light, including forming each holographic grating in the medium according to a schedule that is a substantially linear function of when the holographic recording medium was exposed to the recording light versus the time period of each exposure to the recording light, etc.

Accordingly, one embodiment of the method of the present invention comprises the step of forming a plurality of holographic gratings in a holographic recording medium, wherein each holographic grating in the holographic recording medium is formed by exposing the holographic recording medium to recording light according to a schedule that is a function (e.g., a substantially linear function) of when the holographic recording medium was exposed to the recording light versus the time period of each exposure to the recording light. Another embodiment of the method of the present invention comprises the step of forming at least one additional holographic grating in a holographic recording medium having previously formed therein at least one holographic grating at a time period discrete from the time period when the at least one additional holographic grating is formed and in the same volume thereof. Another embodiment of the method of the present invention comprises the step of forming a plurality of additional holographic gratings in a holographic recording medium and in the same volume thereof having previously formed therein a plurality of holographic gratings at a time period discrete from the time period when the plurality of additional holographic gratings are formed and wherein the plurality of additional holographic gratings are formed according to a schedule that is a function (e.g., a substantially linear function) of when each additional holographic grating is formed versus the time period taken to form each additional holographic grating.

EXAMPLES

Example 1

The following formulation is used:

| Formulation 1 | |
|---|---|
| Ingredient | Wt. % |
| 1,4-Bis(2-thionaphthyl)-2-Butylacrylate | 2.9 |
| Irgacure 784 Photoinitiator | 0.7 |
| WE180 Dicyclohexane Diisocyanate (from Bayer) | 38.9 |
| Glycerol Propoxylate (Mn 1000) | 56.8 |
| Tert-Butyl Hydrogen Peroxide | 0.3 |
| BHT | 0.2 |

Formulation 1 is mixed until homogeneous and then one drop of tin catalyst is added. Matrix samples are made by placing a spacer on a glass slide, then dispensing a portion of the mixture. A second glass slide is placed on top of the dispensed mixture, and the resulting matrix is then allowed to cure. After about 24 hours, the sample is tested on a 532 nm plane wave system by writing 31 angle multiplexed-volume holograms. Formulation 1 is stable at room temperature for at least 4 months and does not overdevelop holograms.

Example 2

The following formulation is used:

| Formulation 2 | |
|---|---|
| Ingredient | Wt. % |
| 1,4-Bis(2-thionaphthyl)-2-Butylacrylate | 3.9 |
| Triphenylphosphine oxide (TPO) Photoinitiator | 0.3 |
| WE180 Dicyclohexane Diisocyanate (from Bayer) | 38.9 |
| Glycerol Propoxylate (Mn 1000) | 56.8 |
| Nitrobenzene | 0.1 |

One drop of tin catalyst is added to formulation 2 and matrix samples are prepared as in Example 1. The samples are tested on a 405 nm plane wave table by writing 31 angle multiplexed-volume holograms. When the nitrobenzene retarder is absent from the formulation, it is found that the matrix samples prepared therefrom are not suitable for high density data storage because the gratings become distorted due to overdevelopment (i.e., polymerization continued after recording).

Example 3

The following formulation is used:

| Formulation 3 | |
| --- | --- |
| Ingredient | Wt. % |
| 1,4-Bis(2-thionaphthyl)-2-Butylacrylate | 4.0 |
| TPO Photoinitiator | 0.3 |
| WE180 Dicyclohexane Diisocyanate (from Bayer) | 38.7 |
| Glycerol Propoxylate (Mn 1000) | 56.0 |
| 2-(1,2-Ethyldiol)-Nitrobenzene | 1.0 |

One drop of tin catalyst is added to formulation 3 and matrix samples are prepared as in Example 1. The 2-(1,2-ethyldiol)-nitrobenzene becomes pendant or attached to the matrix during the cure. The samples are tested on a 405 nm plane wave table by writing 31 angle multiplexed-volume holograms. It is found that more photopolymerization retarder (i.e., 2-(1,2-ethyldiol)-nitrobenzene) is needed than the nitrobenzene of formulation 2 to prevent overdevelopment of holograms. For example, when less than 1 wt % of 2-(1,2-ethyldiol)-nitrobenzene is used, overdevelopment of holograms occurs. However, at room temperature, the archival life of matrix samples prepared from formulation 3 is greatly improved relative to those prepared from formulation 2.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A composition comprising a support matrix and a polymerizable system in the support matrix, the polymerizable system comprising:
a polymerizable component comprising at least one photoactive polymerizable material; and
a photoinitiator component comprising at least one photoinitiator for causing the polymerizable component to polymerize to thereby form at least one holographic grating in a given volume of the holographic recording medium when activated by exposure to a photoinitiating light source;
wherein when a portion of the polymerizable component has been polymerized to form at least one holographic grating in the given volume, further polymerization of the unpolymerized portion of the polymerizable component in the given volume: (1) is deliberately controlled and substantially retarded to minimize dark reactions when not exposed to the photoinitiating light source; and (2) can occur when further exposed to the photoinitiating light source; and
wherein the polymerizable system further comprises one or more polymerization retarders so that further polymerization of the unpolymerized portion of the polymerizable component is deliberately controlled and retarded to minimize dark reactions when not exposed to the photoinitiating light source;
wherein the one or more of the polymerization retarders are attached to the support matrix.

2. The composition of claim 1, wherein the one or more polymerization retarders comprise 2-(1,2-ethyldiol)-nitrobenzene.

3. The composition of claim 2, wherein the 2-(1,2-ethyldiol)-nitrobenzene comprises an amount up to 1% by weight of the polymerizable system.

4. The composition of claim 1, wherein the one or more polymerization retarders are in an amount of up to 1% by weight of the polymerizable system so that further polymerization of the unpolymerized portion of the polymerizable component in the given volume is deliberately controlled and substantially retarded to minimize dark reactions when not exposed to the photoinitiating light source.

5. The composition of claim 1, wherein the one or more polymerization retarders comprise one or more phenols.

6. The composition of claim 1, wherein the one or more polymerization retarders comprise 2,6-di-t-butyl-p-cresol.

7. The composition of claim 1, wherein the one or more polymerization retarders comprise one or more nitrobenzenes.

8. The composition of claim 1, wherein the one or more polymerization retarders comprise a dinitrobenzene.

9. The composition of claim 1, further comprising a light labile phototerminator so that the unpolymerized portion of the polymerizable component in the given volume resists further polymerization when not exposed to the photoinitiating light source.

10. The composition of claim 9, wherein the light labile phototerminator comprises a cobalt oxime complex.

11. The composition of claim 1, further comprising photoacid generators, photo-base generators or photogenerated radicals so that further polymerization of the unpolymerized portion of the polymerizable component in the given volume is deliberately controlled and substantially retarded to minimize dark reactions when not exposed to the photoinitiating light source.

12. The composition of claim 1, wherein the at least one photoactive polymerizable material undergoes a cationic polymerization when activated by a first wavelength of light, and wherein the system further comprises a photo-base generator that reduces the amount of cationic polymerization by the at least one photoactive polymerizable material when the photo-base generator is activated by a second wavelength of light different from the first wavelength of light.

13. The composition of claim 1, wherein the photoinitiator component comprises one or more of the following: thionin perchlorate with a tetraphenyl borate salt as a coinitiator, diphenyl(2,4,6-trimethylbenzoyl)phosphine oxide, and bis(η-5-2,4-cyclopentadien-1-yl)bis[2,6-difluoro-3-(1H-pyrrol-1-yl)phenyl]titanium.

14. The composition of claim 1, wherein the at least one photoinitiator is activated by radiation having a wavelength between about 200 nm and about 800 nm.

15. The composition of claim 1, wherein the one or more of said polymerization retarders comprise anilines.

16. The composition of claim 1, wherein the one or more of said polymerization retarders comprise chloranil or aniline.

17. The composition of claim 1, wherein the one or more polymerization retarders are in an amount of up to 0.2% by weight of the polymerizable system.

18. The composition of claim 1, wherein the one or more polymerization retarders are in an amount of up to 0.1% by weight of the polymerizable system.

19. The composition of claim 1, further comprising one or more chain transfer agents in the polymerizable system to deliberately control and substantially retard further polymerization of the unpolymerized portion of the polymerizable component in the given volume to minimize dark reactions when not exposed to the photoinitiating light source.

20. The composition of claim 19, wherein the chain transfer agent comprises triethylamine.

21. The composition of claim 1, further comprising metastable reactive centers in the polymerizable system to deliberately control and substantially retard further polymerization of the unpolymerized portion of the polymerizable component in the given volume to minimize dark reactions when not exposed to the photoinitiating light source.

22. The composition of claim 21, wherein the metastable reactive centers comprise nitroxyl radicals.

23. The composition of claim 1, comprising polarity or solvation effects in the polymerizable system to deliberately control and substantially retard further polymerization of the unpolymerized portion of the polymerizable component in the given volume to minimize dark reactions when not exposed to the photoinitiating light source.

24. The composition of claim 23, wherein the polymerizable component comprises a cationic or anionic initiated polymerizable material.

25. The composition of claim 1, comprising counter ion effects in the polymerizable system to deliberately control and substantially retard further polymerization of the unpolymerized portion of the polymerizable component in the given volume to minimize dark reactions when not exposed to the photoinitiating light source.

26. The composition of claim 25, wherein the polymerizable component comprises a cationic or anionic initiated polymerizable material.

27. The composition of claim 1, wherein changes in photoactive polymerizable material reactivity are used in the polymerizable system to deliberately control and substantially retard further polymerization of the unpolymerized portion of the polymerizable component in the given volume to minimize dark reactions when not exposed to the photoinitiating light source.

28. The composition of claim 27, wherein the polymerizable component comprises an acrylate and an amount of alpha methyl styrene sufficient to retard the polymerization of the acrylate when not exposed to the photoinitiating light source.

29. The composition of claim 1, wherein when a given volume of the photoactive polymerizable material has been exposed to the photoinitiating light source and at least one holographic grating has been formed in the given volume, the given volume has a signal-to-noise ratio which is substantially the same at least 1100 seconds after the at least one holographic grating is formed.

30. An article comprising the composition of claim 1.

31. The composition of claim 30, wherein the support matrix is a thermoplastic.

32. The composition of claim 30, wherein the support matrix is a thermoset.

* * * * *